United States Patent
Park

(10) Patent No.: US 9,419,062 B2
(45) Date of Patent: Aug. 16, 2016

(54) ORGANIC LIGHT EMITTING DISPLAY DEVICES

(75) Inventor: Myoung-Seo Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 1009 days.

(21) Appl. No.: 13/371,179

(22) Filed: Feb. 10, 2012

(65) Prior Publication Data

US 2013/0099659 A1 Apr. 25, 2013

(30) Foreign Application Priority Data

Oct. 20, 2011 (KR) .................. 10-2011-0107651

(51) Int. Cl.
*H01J 1/62* (2006.01)
*H01L 27/32* (2006.01)
*H01L 51/50* (2006.01)

(52) U.S. Cl.
CPC ........ *H01L 27/3246* (2013.01); *H01L 51/5012* (2013.01)

(58) Field of Classification Search
CPC .................................................. H01L 27/3246
See application file for complete search history.

(56) References Cited

U.S. PATENT DOCUMENTS

| | | | |
|---|---|---|---|
| 7,285,910 B2 | 10/2007 | Park et al. | |
| 8,383,453 B2 | 2/2013 | Kim | |
| 8,389,323 B2 | 3/2013 | Choi et al. | |
| 9,105,867 B2 | 8/2015 | Verschuuren et al. | |
| 2007/0248746 A1 | 10/2007 | Ito et al. | |
| 2009/0209161 A1 | 8/2009 | Nellissen | |
| 2010/0163859 A1* | 7/2010 | Yamazaki et al. | 257/40 |
| 2011/0108880 A1* | 5/2011 | Yanagihara | 257/100 |

FOREIGN PATENT DOCUMENTS

| | | |
|---|---|---|
| CN | 1499902 A | 5/2004 |
| CN | 1689377 A | 10/2005 |
| CN | 102110788 A | 6/2011 |
| CN | 102157707 A | 8/2011 |
| JP | 2007-287623 A | 11/2007 |

(Continued)

OTHER PUBLICATIONS

Chinese Office Action issued on Feb. 3, 2016 by SIPO in connection with Chinese Patent Application No. 201210061292.0.

(Continued)

*Primary Examiner* — Andrew Coughlin
(74) *Attorney, Agent, or Firm* — Robert E. Bushnell, Esq.

(57) ABSTRACT

An organic light emitting display device includes a plurality of first electrodes, a pixel defining layer, a first intermediate layer, a fluorine-containing layer, an emitting layer and a second electrode. The first electrodes are spaced apart from each other on a substrate. The pixel defining layer is disposed on the substrate. The pixel defining layer partially exposes the first electrodes. The first intermediate layer is disposed on the substrate, the pixel defining layer and the exposed first electrodes. The fluorine-containing layer is formed on a portion of the first intermediate layer overlapping an upper surface of the pixel defining layer. The fluorine-containing layer includes fluorine diffused from the pixel defining layer or the first intermediate layer. The emitting layer is at least partially disposed on a portion of the first intermediate layer not including the fluorine-containing layer thereon. The second electrode is disposed on the emitting layer.

50 Claims, 21 Drawing Sheets

(56) References Cited

FOREIGN PATENT DOCUMENTS

| | | |
|---|---|---|
| KR | 10-2011-0013930 | 2/2011 |
| KR | 10-2011-0050409 | 5/2011 |
| TW | 200921756 A1 | 5/2009 |

OTHER PUBLICATIONS

Taiwanese Office Action issued on May 20, 2016 for Taiwanese patent application No. 101123382 and Request for Entry of the Accompanying Office Action attached herewith.

* cited by examiner

1st direction
⊗——— 2nd direction

1st direction
⊗——— 2nd direction

2nd direction
⊗———1st direction

2nd direction
⊗———1st direction

2nd direction
⊗ ——▶ 1st direction

2nd direction
⊗ ——▶ 1st direction

2nd direction
⊗——→1st direction

2nd direction
⊗——→1st direction

ORGANIC LIGHT EMITTING DISPLAY DEVICES

CLAIM OF PRIORITY

This application makes reference to, incorporates the same herein, and claims all benefits accruing under 35 U.S.C. §119 from an application earlier filed in the Korean Intellectual Property Office (KIPO) on the 20th of Oct. 2011 and there duly assigned Serial No. 10-2011-0107651.

BACKGROUND OF THE INVENTION

1. Field of the Invention

The present invention relates to organic light emitting devices. More particularly, the invention relates to organic light emitting devices having novel structures.

2. Description of the Related Art

An organic light emitting display (OLED) device may display desired information such as images, letters and/or characters using a light generated by the combination of holes provided from an anode and electrons provided from a cathode in an organic layer thereof. The OLED device may have several advantages, such as wide viewing angle, high response time, thin thickness and low power consumption, so that the OLED device may be widely employed in various electrical and electronic apparatuses. Recently, the OLED device has been rapidly developed as one of the most promising display devices.

To form an organic emitting layer of the OLED device, a printing process using an inkjet, a spin or a nozzle, a patterning process after depositing layers, and a transfer process using heat or laser have been utilized. However, the organic emitting layer may not be formed uniformly in a pixel region of the OLED device with high resolution and/or contrast by the above-mentioned processes. Particularly, as the size of the OLED device increases, the organic emitting layer may not be precisely patterned in a predetermined region with a high resolution.

SUMMARY OF THE INVENTION

The present invention provides an organic light emitting display device including an intermediate layer that may be divided into patterns having different properties relative to each other.

According to exemplary embodiments of the invention, there is provided an organic light emitting display device. The OLED device includes a plurality of first electrodes, a pixel defining layer, a first intermediate layer, a fluorine-containing layer, an emitting layer and a second electrode. The first electrodes are spaced apart from each other on a substrate. The pixel defining layer is disposed on the substrate. The pixel defining layer partially exposes the first electrode. The first intermediate layer is disposed on the substrate, the pixel defining layer and the exposed first electrode. The fluorine-containing layer is formed on a portion of the first intermediate layer overlapping an upper surface of the pixel defining layer. The fluorine-containing layer includes fluorine diffused from the pixel defining layer or the first intermediate layer. The emitting layer is at least partially disposed on a portion of the first intermediate layer not including the fluorine-containing layer thereon. The second electrode is disposed on the emitting layer.

In the exemplary embodiments, the first intermediate layer may include a first pattern overlapping the exposed first electrode and a second pattern overlapping the pixel defining layer. The second pattern may have an electrical conductivity less than that of the first pattern, or an electrical resistance greater than that of the first pattern. The second pattern may have an upper surface higher than that of the first pattern. The fluorine-containing layer may be formed on the second pattern.

In the exemplary embodiments, the first intermediate layer may further include a third pattern overlapping a portion of the substrate between the adjacent first electrodes spaced apart from each other. The third pattern may have an electrical conductivity less than that of the first pattern, or an electrical resistance greater than that of the first pattern. The fluorine-containing layer may include a first fluorine-containing layer on the second pattern and a second fluorine-containing layer on the third pattern. The third pattern may have an upper surface higher than that of the first pattern.

In the exemplary embodiments, the OLED device may further include a lead and a third electrode. The lead may be disposed on the substrate so as to be spaced apart from the first electrode. The third electrode may extend on the second electrode and the substrate. The third electrode may be electrically connected to the lead. The third electrode may be spaced apart from the first electrode by an insulation layer pattern including the pixel defining layer and the first intermediate layer.

In the exemplary embodiments, the insulation layer pattern and the second electrode may share a common etched surface.

According to the exemplary embodiments, there is provided an organic light emitting display device. The OLED device includes a first electrode, a first intermediate layer, an emitting layer and a second electrode. A plurality of first electrodes is provided, and the first electrodes are spaced apart from each other on a substrate. The first intermediate layer covering the first electrode is disposed on the substrate. The emitting layer is disposed on the first intermediate layer. The emitting layer overlaps the first electrode. The second electrode is disposed on the emitting layer. The first intermediate layer includes a first pattern overlapping the first electrode, a second pattern confining a lateral portion of the emitting layer, and a third pattern overlapping a portion of the substrate between the adjacent first electrodes spaced apart from each other. The third pattern has an electrical conductivity less than that of the first pattern or an electrical resistance greater than that of the first pattern.

In the exemplary embodiments, the emitting layer may extend continuously over the plurality of first electrodes. Alternatively, the emitting layer may be confined by the second pattern and the third pattern so as to have an island shape.

In the exemplary embodiments, the third pattern may have an ink-affinity less than that of the first pattern.

In the exemplary embodiments, a fluorine-containing layer may be disposed on the third pattern. The fluorine-containing layer may include fluorine diffused from the first intermediate layer.

In the exemplary embodiments, the third pattern may have an upper surface higher than that of the first pattern.

In the exemplary embodiments, the second pattern may have an ink-affinity less than that of the first pattern.

In the exemplary embodiments, a fluorine-containing layer may be disposed on the second pattern. The fluorine-containing layer may include fluorine diffused from the first intermediate layer.

In the exemplary embodiments, the second pattern may have an electrical conductivity less than that of the first pattern or an electrical resistance greater than that of the first pattern.

In the exemplary embodiments, the OLED device may further include a lead and a third electrode. The lead may be disposed on the substrate so as to be spaced apart from the first electrode. The third electrode may extend on the second electrode and the substrate. The third electrode may be electrically connected to the lead. The third electrode may be spaced apart from the first electrode by an insulation layer pattern including the first intermediate layer.

In the exemplary embodiments, the insulation layer pattern and the second electrode may share a common etched surface.

According to the exemplary embodiments, there is provided an organic light emitting display device. The OLED device includes a first electrode, a first intermediate layer, an emitting layer and a second electrode. A plurality of first electrodes is provided, and the first electrodes are spaced apart from each other on a substrate. The first intermediate layer covering the first electrode is disposed on the substrate. The emitting layer is disposed on the first intermediate layer. The emitting layer overlaps the first electrode. The second electrode is disposed on the emitting layer. The first intermediate layer includes a first pattern overlapping the first electrode, a second pattern confining a lateral portion of the emitting layer, and a third pattern overlapping a portion of the substrate between the adjacent first electrodes spaced apart from each other. The third pattern may have an ink-affinity less than that of the first pattern.

In the exemplary embodiments, a fluorine-containing layer may be disposed on the third pattern. The fluorine-containing layer may include fluorine diffused from the first intermediate layer.

In the exemplary embodiments, the third pattern may have an electrical conductivity less than that of the first pattern or an electrical resistance greater than that of the first pattern. The third pattern may have an upper surface higher than that of the first pattern.

In the exemplary embodiments, the second pattern may have an ink-affinity less than that of the first pattern.

In the exemplary embodiments, a fluorine-containing layer may be disposed on the second pattern. The fluorine-containing layer may include fluorine diffused from the first intermediate layer.

In the exemplary embodiments, the second pattern may have an electrical conductivity less than that of the first pattern or an electrical resistance greater than that of the first pattern.

In the exemplary embodiments, the emitting layer may extend continuously over the plurality of first electrodes. Alternatively, the emitting layer may be confined by the second pattern and the third pattern so as to have an island shape.

In the exemplary embodiments, the OLED device may further include a lead and a third electrode. The lead may be disposed on the substrate so as to be spaced apart from the first electrode. The third electrode may extend on the second electrode and the substrate. The third electrode may be electrically connected to the lead. The third electrode may be spaced apart from the first electrode by an insulation layer pattern including the first intermediate layer.

In the exemplary embodiments, the insulation layer pattern and the second electrode may share a common etched surface.

According to the exemplary embodiments, there is provided an organic light emitting display device. The OLED device includes a first electrode, a first intermediate layer, an emitting layer and a second electrode. A plurality of first electrodes is provided, and the first electrodes are spaced apart from each other on a substrate. The first intermediate layer covering the first electrode is disposed on the substrate. The emitting layer is disposed on the first intermediate layer. The emitting layer overlaps the first electrode. The second electrode is disposed on the emitting layer. The first intermediate layer includes a first pattern overlapping the first electrode, a second pattern confining a lateral portion of the emitting layer, and a third pattern overlapping a portion of the substrate between the adjacent first electrodes spaced apart from each other. The third pattern may have an electrical conductivity greater than that of the second pattern or an electrical resistance less than that of the second pattern.

In the exemplary embodiments, a fluorine-containing layer may be disposed on the second pattern. The fluorine-containing layer may include fluorine diffused from the first intermediate layer.

In the exemplary embodiments, the second pattern may have an upper surface higher than that of the third pattern.

In the exemplary embodiments, the OLED device may further include a lead and a third electrode. The lead may be disposed on the substrate so as to be spaced apart from the first electrode. The third electrode may extend on the second electrode and the substrate. The third electrode may be electrically connected to the lead. The third electrode may be spaced apart from the first electrode by an insulation layer pattern including the first intermediate layer.

In the exemplary embodiments, the insulation layer pattern and the second electrode may share a common etched surface.

According to the exemplary embodiments, there is provided an organic light emitting display device. The OLED device includes a first electrode, a first intermediate layer, an emitting layer and a second electrode. A plurality of first electrodes is provided, and the first electrodes are spaced apart from each other on a substrate. The first intermediate layer covering the first electrode is disposed on the substrate. The emitting layer is disposed on the first intermediate layer. The emitting layer overlaps the first electrode. The second electrode is disposed on the emitting layer. The first intermediate layer includes a first pattern overlapping the first electrode, a second pattern confining a lateral portion of the emitting layer, and a third pattern overlapping a portion of the substrate between the adjacent first electrodes spaced apart from each other. The third pattern may have an ink-affinity greater than that of the second pattern.

In the exemplary embodiments, a fluorine-containing layer may be disposed on the second pattern. The fluorine-containing layer may include fluorine diffused from the first intermediate layer.

In the exemplary embodiments, the second pattern may have an electrical conductivity less than that of the third pattern or an electrical resistance greater than that of the third pattern. The second pattern may have an upper surface higher than that of the third pattern.

In the exemplary embodiments, the OLED device may further include a lead and a third electrode. The lead may be disposed on the substrate so as to be spaced apart from the first electrode. The third electrode may extend on the second electrode and the substrate. The third electrode may be electrically connected to the lead. The third electrode may be spaced apart from the first electrode by an insulation layer pattern including the first intermediate layer.

In the exemplary embodiments, the insulation layer pattern and the second electrode may share a common etched surface.

According to the exemplary embodiments, the OLED device may include a fluorine-containing layer having a relatively low ink-affinity. The fluorine-containing layer may be formed on a portion of a first intermediate layer overlapping a pixel defining layer of the OLED device. The first intermediate layer may include a first pattern, a second pattern and/or a third pattern, each of which may have chemical properties (e.g., hydrophilicity, hydrophobicity, surface energy, etc.) and/or electrical properties (e.g., electrical conductivity, resistance, etc.) different from one another. A pixel region may be confined or limited by the fluorine-containing layer, the first pattern, the second pattern and/or the third pattern so that an emitting layer may be formed selectively in the pixel region. Therefore, the OLED device having a high resolution which may not be easily manufactured by a conventional printing process may be obtained.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
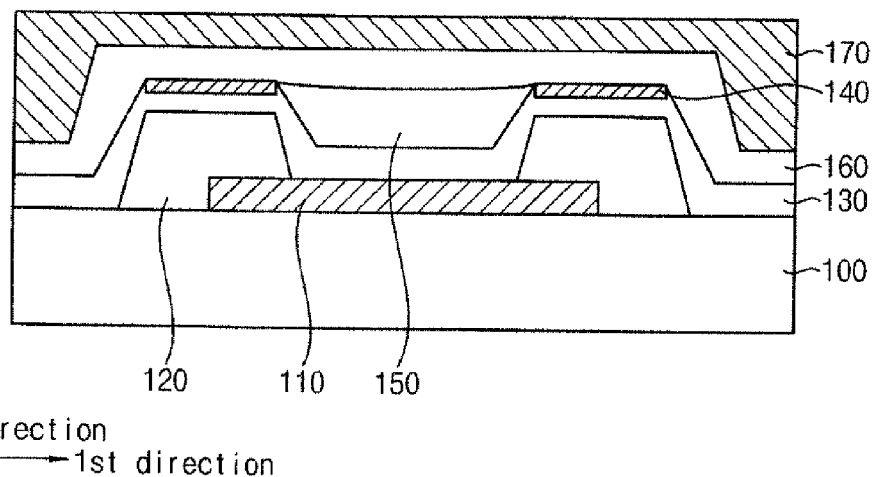
FIG. 1 is a cross-sectional view illustrating an organic light emitting display device in accordance with exemplary embodiments of the invention.

Various exemplary embodiments of the invention will be described more fully hereinafter with reference to the accompanying drawings, in which some exemplary embodiments are shown. The invention may, however, be embodied in many different forms and should not be construed as limited to the exemplary embodiments set forth herein. Rather, these exemplary embodiments are provided so that this description will be thorough and complete, and will fully convey the scope of the invention to those skilled in the art. In the drawings, the sizes and relative sizes of layers and regions may be exaggerated for clarity.

It will be understood that, when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element or feature (or other elements or features) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, components and/or groups thereof, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device, and are not intended to limit the scope of the invention.

Unless otherwise defined, all terms (including technical and scientific terms) used herein have the same meaning as commonly understood by one of ordinary skill in the art to which this invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an organic light emitting display device in accordance with exemplary embodiments of the invention.

Referring to FIG. 1, the organic light emitting display (OLED) device may include a substrate 100, a first electrode 110, a pixel defining layer (PDL) 120, a first intermediate layer 130, a fluorine-containing layer 140, an emitting layer (EML) 150, a second intermediate layer 160, a second electrode 170, etc.

The substrate 100 may include a lower substrate (not illustrated) and lower structures (not illustrated) disposed on the lower substrate. The lower structures may include a switching device, an insulation layer, etc. The lower substrate may also include a transparent substrate such as a glass substrate, a quartz substrate, a transparent plastic substrate, etc. For example, the transparent plastic substrate may include polyimide, acryl-based resin, polyethylene terephthalate (PET), polycarbonate, polyacrylate, polyether, etc. The switching device may include a thin film transistor (TFT) or an oxide semiconductor device.

The first electrode 110 may be disposed on the substrate 100 having the lower structures. In exemplary embodiments, a plurality of the first electrodes 110 spaced apart from each other may be disposed on the substrate 100 regularly in a first direction. Furthermore, a plurality of the first electrodes 110 spaced apart from each other may be disposed in a second direction substantially perpendicular to the first direction.

The first electrode 110 may serve as a transparent electrode or a reflective electrode according to types of the OLED device, for example, a top-emission type or a back-emission type. In the case wherein the first electrode 110 serves as the transparent electrode, the first electrode 110 may include a transparent conductive material having a relatively high work function such as indium tin oxide (ITO), zinc tin oxide (ZTO), indium oxide (InOx), indium zinc oxide (IZO), zinc oxide (ZnO$_x$), tin oxide (SnO$_x$), gallium zinc oxide (GZO), gallium indium zinc oxide (GIZO), aluminum-doped zinc oxide (AZO), etc. These may be used alone or in a combination thereof.

In the case wherein the first electrode 110 serves as a reflective electrode, the first electrode 110 may include a metal such as silver (Ag), aluminum (Al), platinum (Pt), gold (Au), chromium (Cr), tungsten (W), molybdenum (Mo), titanium (Ti), palladium (Pd), etc., or an alloy of these metals. In one exemplary embodiment, the first electrode 110 may have a multi-stacked structure including a first layer and a second layer. The first layer may include, e.g., the above metal or the alloy, and the second layer may include, e.g., the above transparent conductive material. In this case, the first electrode 110 may serve as a semi-transparent electrode. In exemplary embodiments, the first electrode 110 may serve as an anode providing holes into the first intermediate layer 130.

The PDL 120 may be disposed on the substrate 100 and the first electrode 110. The PDL 120 may partially expose the first electrode 110 so as to define pixel regions of the OLED device. In exemplary embodiments, the PDL 120 may include a polymer containing a carbon-carbon chain. The PDL 120 may serve as an insulator. Thus, the PDL 120 may function as a black matrix when the OLED device is a back-emission type.

The first intermediate interlayer 130 may be disposed on the substrate 100, the PDL 120 and the exposed first electrode 110. In exemplary embodiments, the first intermediate layer 130 may include a hole transport layer (HTL). The HTL may include a hole transport material, for example, 4,4'-bisbiphenyl (NPB), N,N'-diphenyl-N,N'-bis(3-methylphenyl)-1,1'-biphenyl-4,4-diamine (TPD), N,N'-di-1-naphtyl-N,N'-diphenyl-1,1'-biphenyl-4,4'-diamine (NPD), N-phenylcarbazole, polyvinylcarbazole, or a mixture of these materials. In one exemplary embodiment, the first intermediate layer 130 may include a hole injection layer (HIL) (not illustrated) beneath the HTL. The HIL may facilitate a hole injection from the first electrode 100 to the HTL. For example, the HIL may include cupper phthalocyanine (CuPc), poly(3,4)-ethylenedioxythiophene (PEDOT), polyaniline (PANI) or a mixture of these materials.

The fluorine-containing layer 140 may be formed on an upper surface of the first intermediate layer 130 substantially overlapping an upper surface of the PDL 120. Hereinafter, the upper surface of the first intermediate layer 130 on which the fluorine-containing layer 140 is formed may be referred to as a second surface, and a remaining upper surface of the first intermediate layer 130 on which the fluorine-containing layer 140 is not formed may be referred to as a first surface. The first surface may substantially overlap the exposed first electrode 110. As illustrated in FIG. 1, the fluorine-containing layer 140 may substantially overlap the upper surface of the PDL 120. In an exemplary embodiment, the fluorine-containing layer 140 may also partially overlap a sidewall of the PDL 120.

In exemplary embodiments, the second surface including the fluorine-containing layer 140 may be hydrophobic. Furthermore, the second surface may have surface energy and/or ink-affinity substantially lower than those of the first surface. The fluorine-containing layer 140 may include fluorine atoms, fluorine ions or fluorine-containing ions that may be diffused from the PDL 120, and may be fixed at the second surface of the first intermediate layer 130. A process for forming the fluorine-containing layer 140 may be described in detail with reference to FIGS. 27 through 33 that illustrate a method of manufacturing the OLED device in exemplary embodiments.

The EML 150 may be disposed on the first surface of the first intermediate layer 130. The EML 150 may include at least one of light emitting materials for generating different colors of light, for example, a red color of light, a green color of light or a blue color of light. The EML 150 may include a mixture or a combination of the light emitting materials for generating a white color of light. The EML 150 may further include a fluorescent host material or a phosphorescent host material having a relatively large band gap.

In exemplary embodiments, the EML 150 may be selectively disposed on the first surface on which the fluorine-containing layer 140 is not formed. Thus, the light emitting materials of the EML 150 may be prevented from being deposited or diffused onto non-pixel regions substantially overlapping the PDL 120 and from blurring or smearing the non-pixel regions. As a result, the OLED device may have improved luminescent characteristics including, e.g., resolution, contrast, etc.

The second intermediate layer 160 may be formed on the first intermediate layer 130 so as to cover the fluorine-containing layer 140 and the EML 150. In exemplary embodiments, the second intermediate layer 160 may include an electron transport layer (ETL). The ETL may include, e.g., tris(8-quinolinolato)aluminum (III) (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), etc. These may be used alone or in a mixture thereof.

In one exemplary embodiment, the second intermediate layer 160 may further include an electron injection layer (EIL) (not illustrated) disposed on the ETL. The EIL may include an alkaline metal, an alkaline earth metal, fluorides of these metals, oxides of these metals, etc. These may be used alone or in a mixture thereof.

The second electrode 170 may be disposed on the second intermediate layer 160. In the case wherein the second electrode 170 serves as a transparent electrode, the second electrode 170 may include a transparent conductive material such as indium tin oxide, zinc tin oxide, indium oxide, indium zinc oxide, zinc oxide, tin oxide, gallium zinc oxide, gallium indium zinc oxide, aluminum-doped zinc oxide, etc. In the case wherein the second electrode 170 serves as a reflective electrode, the second electrode 170 may include a metal such as silver, aluminum, platinum, gold, chromium, tungsten, molybdenum, titanium, palladium, etc., or an alloy of these metals. In one exemplary embodiment, the second electrode 170 may have a multi-stacked structure including a first layer and a second layer. The first layer may include, e.g., the above metal or the alloy, and the second layer may include, e.g., the above transparent conductive material. The second electrode 170 may serve as a cathode providing electrons into the second intermediate layer 160.

In some exemplary embodiments, a third electrode (not illustrated) may be further disposed on the second electrode 170 and the substrate 100. The third electrode may be electrically connected to a lead (not illustrated) that may be formed on a peripheral portion of the substrate 100 so as to be spaced apart from the first electrode 110. A structure of the third electrode and a method of forming the third electrode will be described in detail with reference to FIGS. 31 through 33.

A protection layer (not illustrated) and an upper substrate (not illustrated) may be sequentially disposed on the second electrode 170. The protection layer may include a transparent conductive material and the upper substrate may include a transparent insulating substrate.

Figure 2:
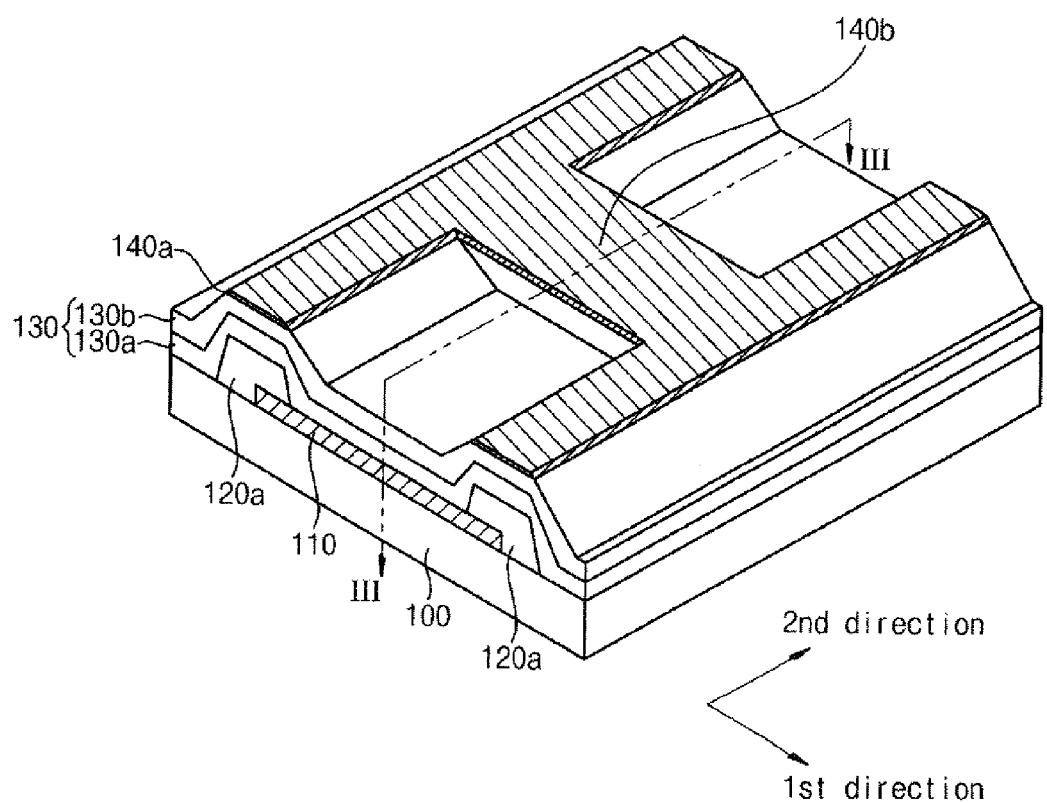
FIGS. 2 through 4 are perspective and cross-sectional views illustrating the organic light emitting display device of FIG. 1.
Figure 3:
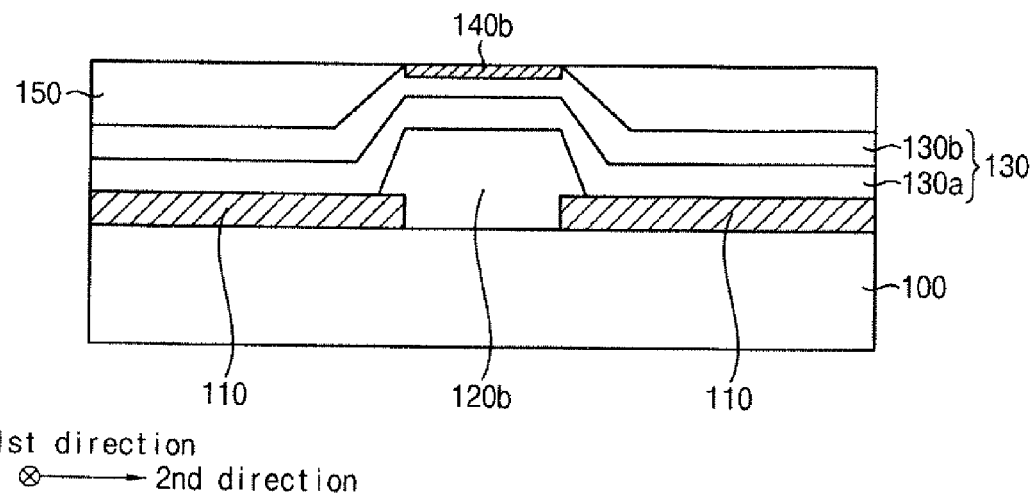
Figure 4:
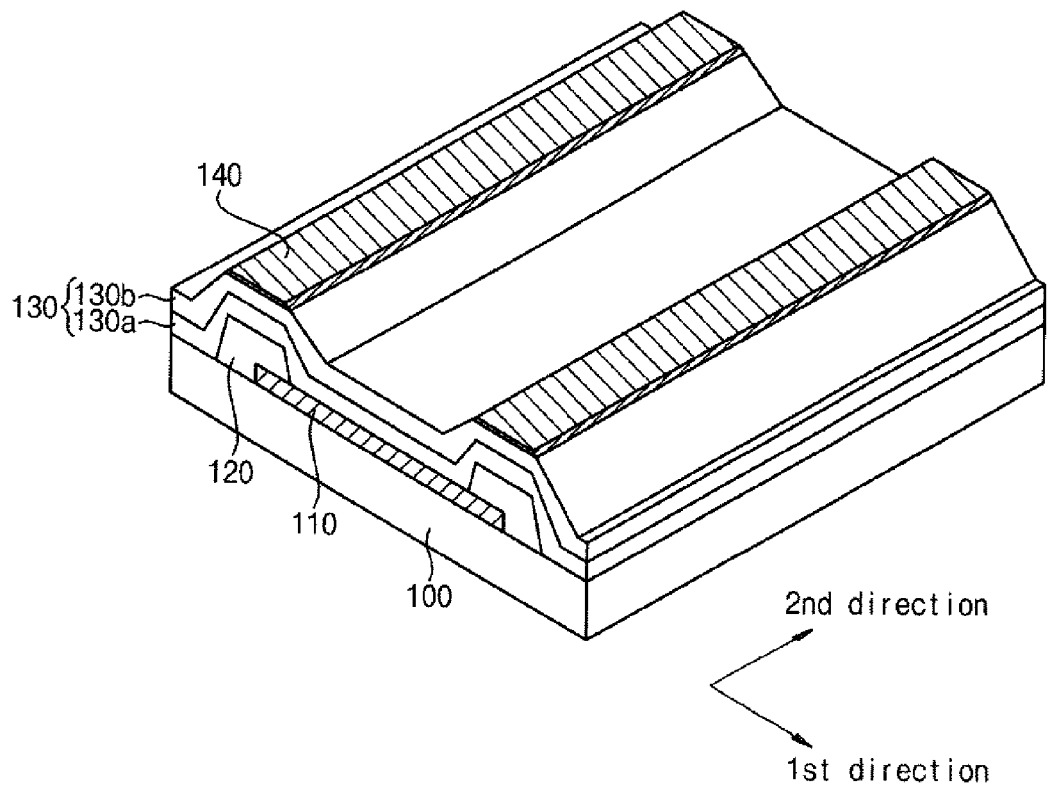

FIGS. 2 through 4 are perspective and cross-sectional views illustrating the organic light emitting display device of FIG. 1. Specifically, FIGS. 2 and 4 are perspective views illustrating the OLED devices of FIG. 1 in accordance with exemplary embodiments. FIG. 3 is a cross-sectional view taken along a line of FIG. 2. In FIGS. 2 and 4, the EML 150, the second intermediate layer 160 and the second electrode 170 of FIG. 1 are not illustrated for convenience of explanation. As illustrated in FIGS. 2 through 4, the first intermediate layer 130 may include an HIL 130a and an HTL 130b sequentially formed on the substrate 100, the PDL 120 and the first electrode 110.

Referring to FIGS. 2 and 3, the PDL 120 may have a substantially "H" shape. For example, the PDL 120 may include a first line pattern 120a (see FIG. 2) and a second line pattern 120b (see FIG. 3). In exemplary embodiments, a plurality of the first line patterns 120a may extend in the second direction and a plurality of the second line patterns 120b may extend in the first direction. The first and second line patterns 120a and 120b, respectively, may meet each other so as to define pixel regions having lattice or grid structures.

The fluorine-containing layer 140 may include a first fluorine-containing layer 140a (FIG. 2) and a second fluorine-containing layer 140b (FIG. 3). The first fluorine-containing layer 140a may substantially overlap an upper surface of the first line pattern 120a and the second fluorine-containing layer 140b may substantially overlap an upper surface of the second line pattern 120b. The first and second fluorine-containing layers 140a and 140b, respectively, may also meet each other in a manner substantially the same as or similar to that of the first and second line patterns 120a and 120b, respectively.

As illustrated in FIG. 3, the second line pattern 120b of the PDL 120 may be disposed between the adjacent first electrodes 110 spaced apart from each other in the second direction. The second fluorine-containing layer 140b may be formed on an upper surface of the first intermediate layer 130 substantially overlapping the upper surface of the second line pattern 120b. Accordingly, the EML 150 may be separated in the second direction by the second fluorine-containing layer 140b. Similarly, the EML 150 may be separated in the first direction by the first fluorine-containing layer 140a.

In one exemplary embodiment, the fluorine-containing layer 140 may be disposed only over the first line pattern 120a. For example, only the first fluorine-containing layer 140a may be formed.

Referring to FIG. 4, the PDL 120 may have a linear shape extending in the second direction. For example, the PDL 120 may only include the first line pattern 120a illustrated in FIG. 2. The fluorine-containing layer 140 may be formed on the upper surface of the first intermediate layer 130 substantially overlapping the upper surface of the PDL 120.

Figure 5:
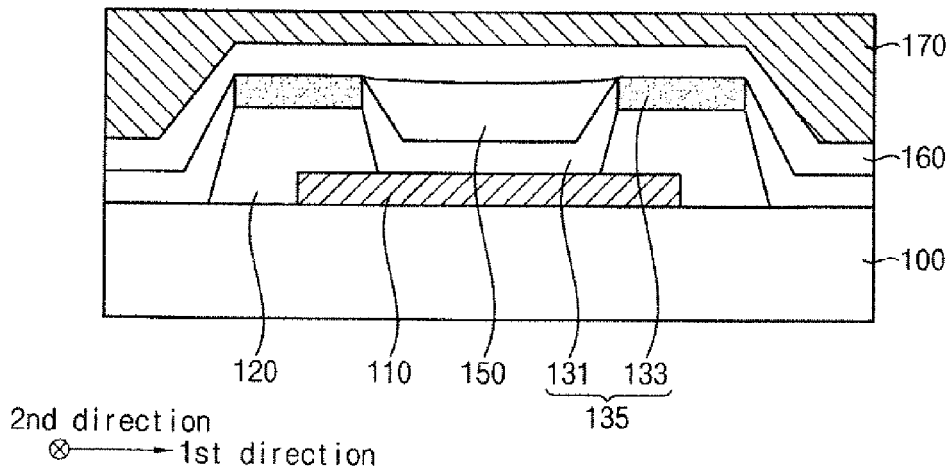
FIG. 5 is a cross-sectional view illustrating an organic light emitting display device in accordance with some exemplary embodiments of the invention.

FIG. 5 is a cross-sectional view illustrating an organic light emitting display device in accordance with some exemplary embodiments of the invention. The OLED device of FIG. 5 may have a construction substantially the same as, or similar to, that of the OLED device of FIG. 1 except for the structure of the first intermediate layer. Thus, like reference numerals refer to like elements and detailed descriptions thereof are omitted herein.

Referring to FIG. 5, a first intermediate layer 135 may include a first pattern 131 and a second pattern 133. The first pattern 131 may be disposed on a first electrode 110 and a sidewall of a PDL 120, and the second pattern 133 may be disposed on an upper surface of a PDL 120. In one exemplary embodiment, the second pattern 133 may extend to a portion of the sidewall of the PDL 120. The first intermediate layer 135 may serve as an HTL of the OLED device. Additionally, an HIL (not shown) may be disposed beneath the HTL. In exemplary embodiments, the second pattern 133 may have an upper surface substantially higher than that of the first pattern 131.

In exemplary embodiments, the first pattern 131 may include the above-mentioned hole transport material. The second pattern 133 may include a cross-linked or polymerized photosensitive material in addition to the hole transport material. Therefore, the second pattern 133 may have an electrical conductivity substantially less than that of the first pattern 131 or an electrical resistance substantially greater than that of the first pattern 131. Additionally, the second pattern 133 may have a surface energy substantially less than that of the first pattern 131.

The photosensitive material may refer to a material capable of being cross-linked and/or polymerized by an exposure process. For example, the photosensitive material may include a negative type photosensitive material. The photosensitive material may include, e.g., an acrylate-based material, a methacrylate-based material, an aromatic olefin-based material or a benzene-based material having a vinyl group. For example, the photosensitive material may include 1,4-butanediol acrylate, 1,3-butylene glycol diacrylate, 1,6-hexanediol diacrylate, diethylene glycol diacrylate, ethylene glycol diacrylate, triethylene glycol diacrylate, polyethylene glycol diacrylate, neopentyl glycol diacrylate, propylene glycol diacrylate, dipropylene glycol diacrylate, sorbitol triacrylate, bisphenol A diacrylate derivatives, pentaerythritol triacrylate, pentaerythritol tetraacrylate, pentaerythritol diacrylate, dip entaerythritol pentaacrylate, dip entaerythritol hexaacrylate, trimethyl propane ethoxy triacrylate or methacrylates of these materials. These may be used alone or in a mixture thereof.

According to exemplary embodiments, the second pattern 133 may have a surface energy substantially less than that of the first pattern 131 so that the second pattern 133 may have a relatively low wettability. Thus, an EML 150 may be formed selectively on the first pattern 131 due to the surface energy difference. Additionally, the second pattern 133 may have a relatively low electrical conductivity or a relatively high electrical resistance so that lateral diffusion of charges may be blocked. Therefore, crosstalk between adjacent pixel regions may be prevented.

In some exemplary embodiments, a third electrode (not illustrated) may be further disposed on a second electrode 170 and a substrate 100. The third electrode may be electrically connected to a lead (not illustrated) that may be formed on a peripheral portion of the substrate 100 so as to be spaced apart from the first electrode 110. In some exemplary embodiments, a protection layer (not illustrated) and an upper substrate (not illustrated) may be sequentially disposed on the second electrode 170.

FIGS. 6 through 14 are perspective and cross-sectional views illustrating the organic light emitting display device of FIG. 5.

Figure 6:
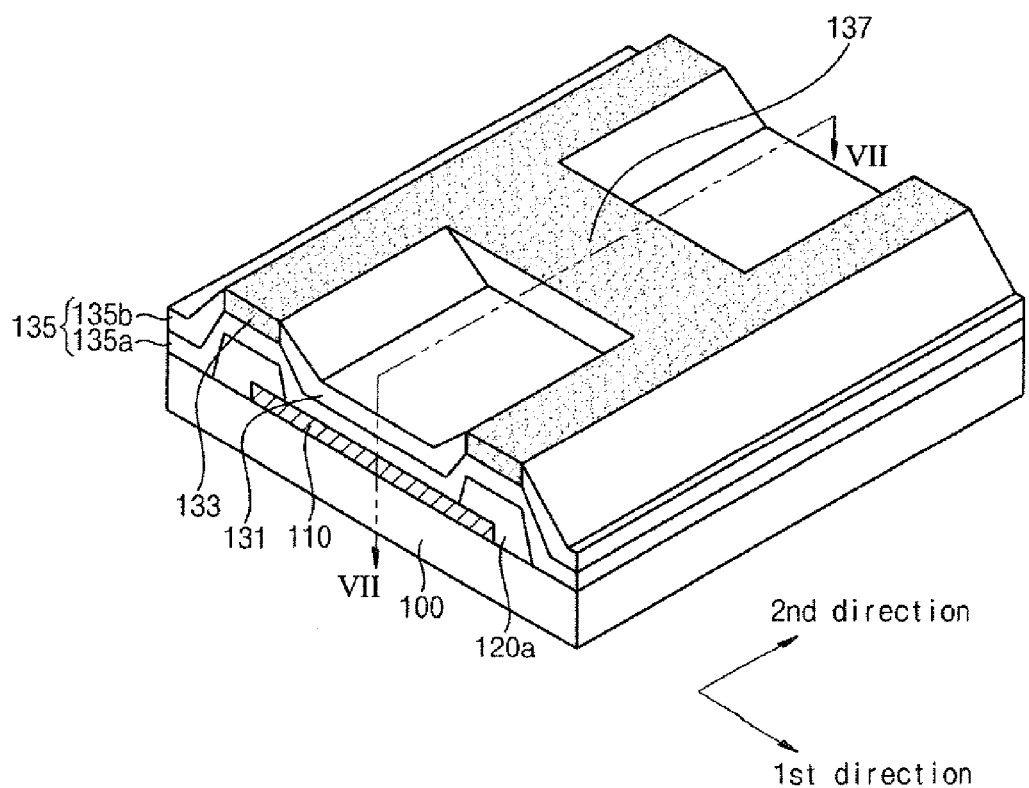
FIGS. 6 through 14 are perspective and cross-sectional views illustrating the organic light emitting display device of FIG. 5.
Figure 7:
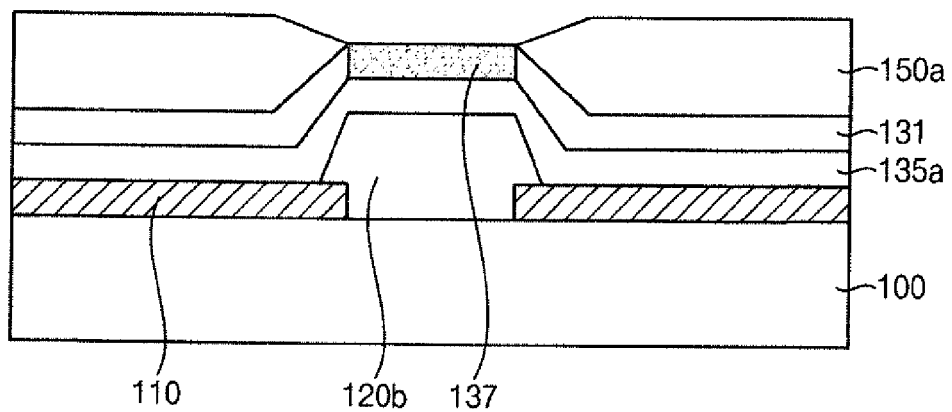
Figure 8:
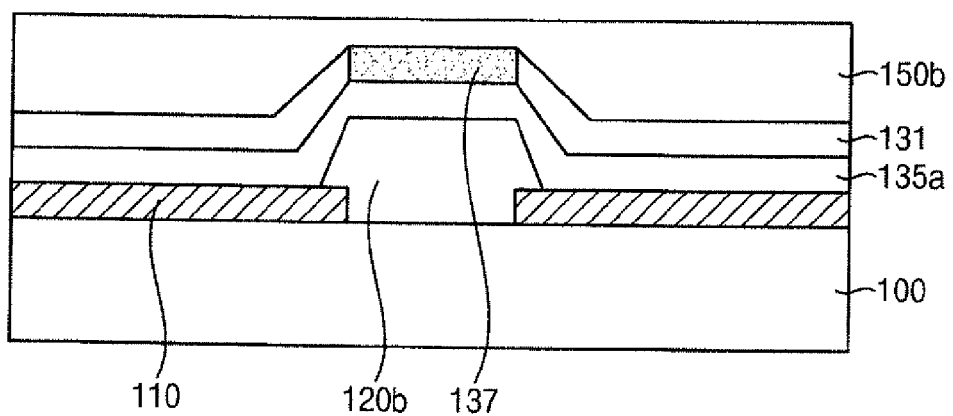
Figure 9:
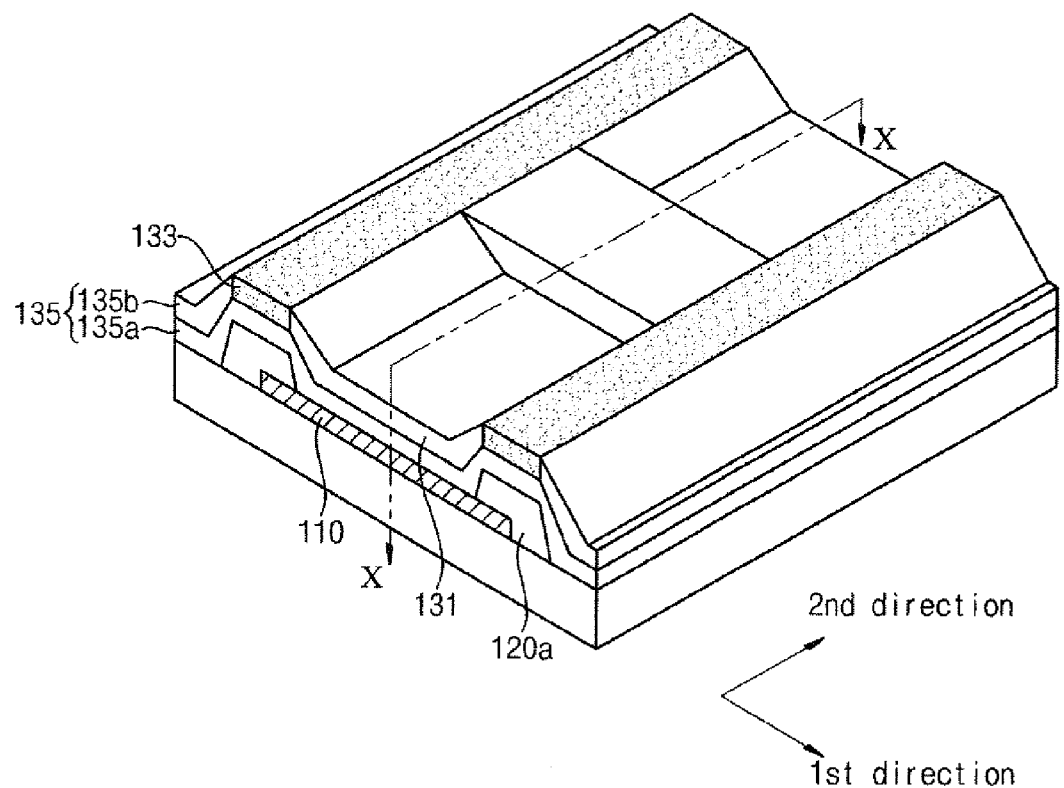
Figure 10:
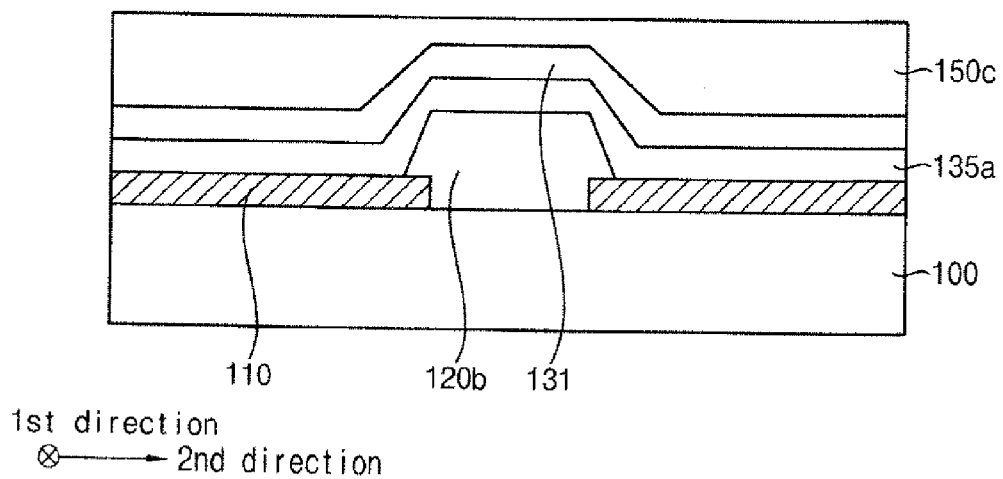

Specifically, FIGS. 6 and 9 are perspective views illustrating the OLED device of FIG. 5 in accordance with exemplary embodiments, FIGS. 7 and 8 are cross-sectional views taken along a line VII-VII of FIG. 6, and FIG. 10 is a cross-sectional view taken along a line X-X of FIG. 9. For convenience of explanation, the EML 150, the second intermediate layer 160 and the second electrode 170 of FIG. 5 are not illustrated on FIGS. 6 and 9. As illustrated in FIGS. 6 through 10, the first intermediate layer 135 may include an HIL 135a and an HTL 135b sequentially formed on the substrate 100, the PDL 120 and the first electrode 110.

Referring to FIGS. 6 through 8, the PDL 120 may have a substantially "H" shape. For example, the PDL 120 may include a plurality of first line patterns 120a (FIG. 6) extending in the second direction and a plurality of second line patterns 120b (FIG. 7) extending in the first direction. The first and second line patterns 120a and 120b, respectively, may meet each other so as to define pixel regions having lattice or grid structures.

The HTL 135b may include first, second and third patterns 131, 133 and 137, respectively. The second pattern 133 may substantially overlap an upper surface of the first line pattern 120a. A portion of the HTL 135b substantially overlapping an upper surface of the second line pattern 120b may be defined as the third pattern 137. A remaining portion of the HTL 135b, except for the second and third patterns 133 and 137, respectively, may be defined as the first pattern 131. The second and third patterns 133 and 137, respectively, may also meet each other in a manner substantially the same as or similar to that of the first and second line patterns 120a and 120b, respectively.

In exemplary embodiments, the third pattern 137 may substantially overlap a portion of the substrate 100 between the adjacent first electrodes 110 spaced apart from each other in the second direction. The second and/or third patterns 133 and 137, respectively, may have upper surfaces substantially higher than that of the first pattern 131.

In exemplary embodiments, the third pattern 137 may have properties substantially the same as, or similar to, those of the second pattern 133. For example, the third pattern 137 may include the above-mentioned hole transport material and the above-mentioned cross-linked or polymerized photosensitive material. Thus, the third pattern 137 may have an electrical resistance substantially greater than that of the first pattern 131 or an electrical conductivity substantially less than that of the first pattern 131. Furthermore, the third pattern 137 may have a surface energy substantially less than that of the first pattern 131.

As illustrated in FIG. 7, the second line pattern 120b of the PDL 120 may be disposed between the adjacent first electrodes 110 spaced apart from each other in the second direction. An EML 150a may be separated in the second direction by the third pattern 137. Similarly, the EML 150a may be separated in the first direction by the second pattern 133.

Meanwhile, an EML 150b may continuously extend on the first pattern 131 and the third pattern 137 in the second direction as illustrated in FIG. 8.

Referring to FIGS. 9 and 10, the third pattern may not be formed over the second line pattern 120b of the PDL 120. In this case, the second pattern 133 of the HTL 135b may substantially overlap the upper surface of the first line pattern 120a of the PDL 120, and a remaining portion of the HTL 135b, except for the second pattern 133, may be defined as the first pattern 131. As illustrated in FIG. 10, an EML 150c may extend on the first pattern 131 in the second direction, and may be separated in the first direction by the second pattern 133.

Figure 11:
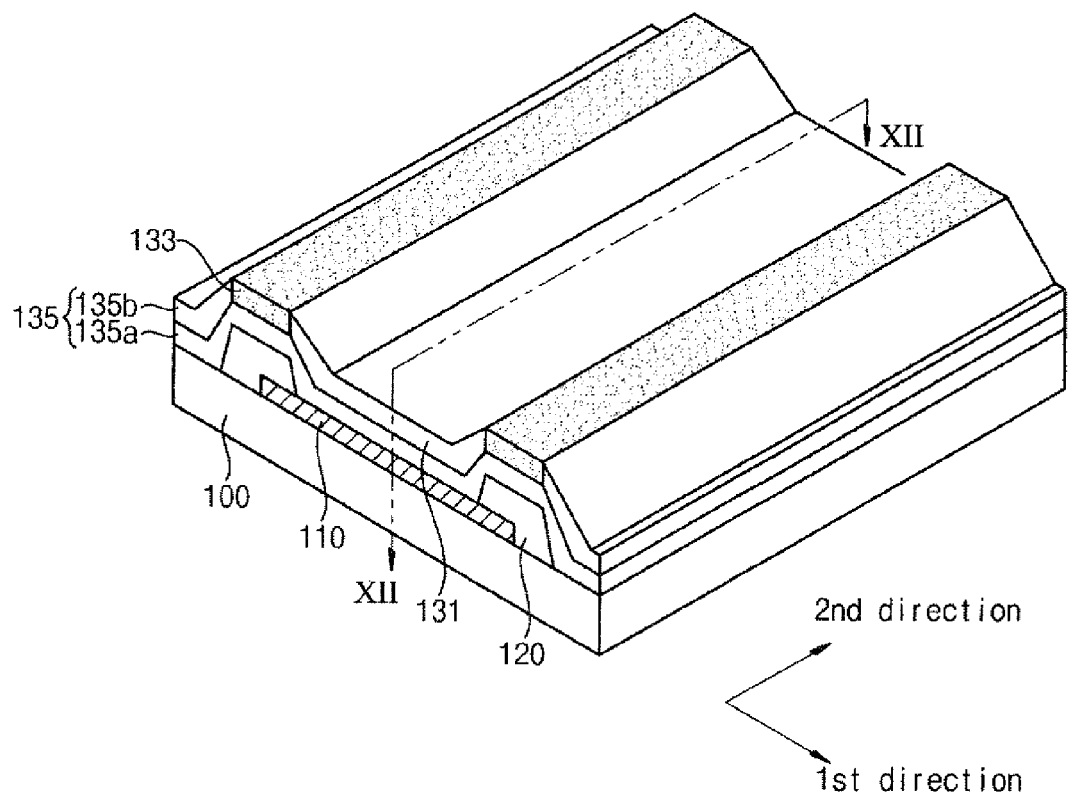
Figure 12:
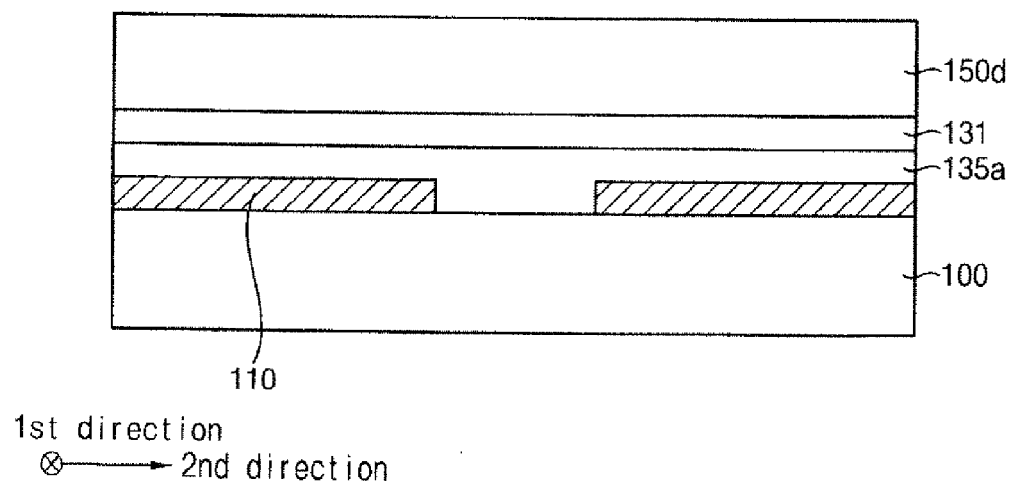

FIG. 11 is a perspective view illustrating one exemplary embodiment of the OLED device of FIG. 5, and FIG. 12 is a cross-sectional view taken along a line XII-XII of FIG. 11.

Referring to FIG. 11, PDL 120 may have a linear shape or a bar shape extending in the second direction. For example, the PDL 120 may only include the first line pattern 120a of FIG. 6. An HTL 135b may include a second pattern 133 substantially overlapping an upper surface of the PDL 120. A remaining portion of the HTL 135b, except for the second pattern 133, may be defined as a first pattern 131. In this case, an EML 150d (FIG. 12) may have a linear shape or a bar shape extending on the first pattern 131 in the second direction as illustrated in FIG. 12. The EML 150d may be separated in the first direction by the second pattern 133.

Figure 13:
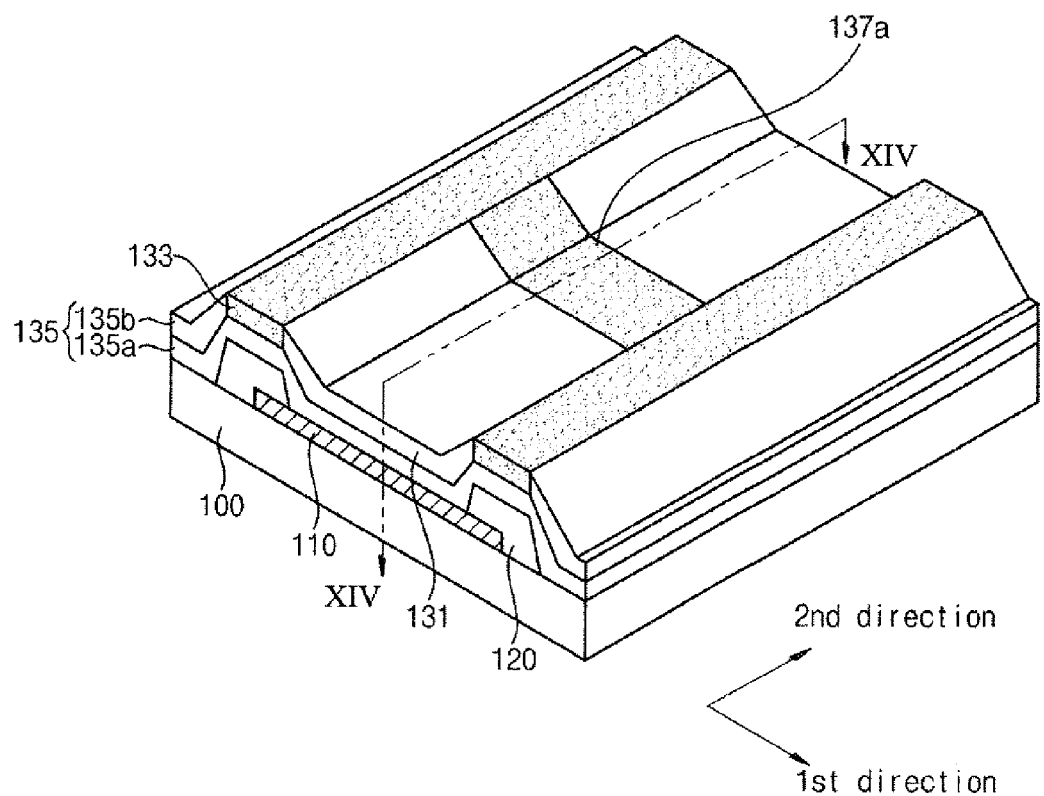
Figure 14:
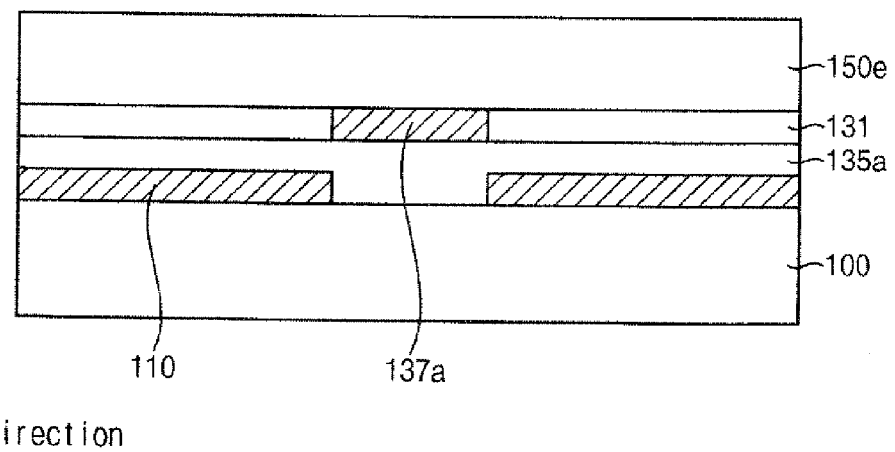

FIG. 13 is a perspective view illustrating one exemplary embodiment of the OLED device of FIG. 5, and FIG. 14 is a cross-sectional view taken along a line XIV-XIV of FIG. 13.

Referring to FIGS. 13 and 14, a PDL 120 may have a linear shape or a bar shape extending in the second direction. An HTL 135b may include first, second and third patterns 131, 133 and 137a, respectively. The second pattern 133 (FIG. 13) may substantially overlap an upper surface of the PDL 120 and may have a linear shape extending in the second direction. The third pattern 137a (FIG. 14) may substantially overlap a portion of a substrate 100 between adjacent first electrodes 110 spaced apart from each other in the second direction. The third pattern 137a may have a linear shape extending in the first direction. A remaining portion of the HTL 135b, except for the second and third patterns 133 and 137a, respectively, may be defined as the first pattern 131.

The third pattern 137a may have an upper surface substantially lower than that of the second pattern 133. The upper surface of the third pattern 137a may be substantially coplanar with that of the first pattern 131. In exemplary embodiments, the third pattern 137a may have properties substantially the same as, or similar to, those of the second pattern 133. For example, the third pattern 137a may include the above-mentioned hole transport material and the above-mentioned cross-linked or polymerized photosensitive material. Thus, the third pattern 137a may have an electrical resistance substantially greater than that of the first pattern 131 or an electrical conductivity substantially less than that of the first pattern 131. Furthermore, the third pattern 137a may have a surface energy substantially less than that of the first pattern 131. In this case, an EML 150e (FIG. 14) may have a linear shape extending on the first pattern 131 and the third pattern 137a in the second direction. The EML 150e may be separated in the first direction by the second pattern 133.

Figure 15:
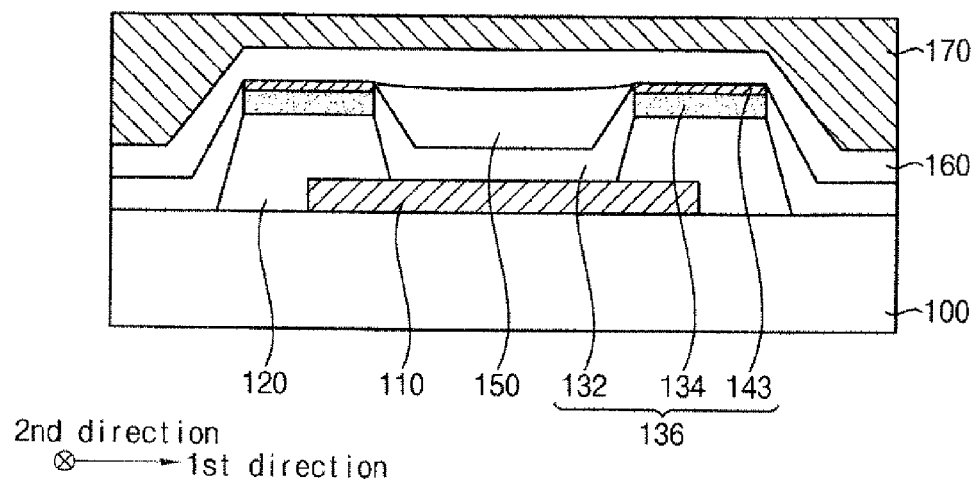
FIG. 15 is a cross-sectional view illustrating an organic light emitting display device in accordance with some exemplary embodiments of the invention.

FIG. 15 is a cross-sectional view illustrating an organic light emitting display device in accordance with some exemplary embodiments. The OLED device of FIG. 15 may have a construction substantially the same as, or similar to, that of the OLED device of FIG. 5 except for a structure of the first intermediate layer. Thus, like reference numerals refer to like elements and detailed descriptions thereof are omitted herein.

Referring to FIG. 15, as described with reference to FIG. 5, a first intermediate layer 136 may include a first pattern 132 and a second pattern 134. The first pattern 132 may be disposed on a first electrode 110 and a sidewall of a PDL 120. The second pattern 134 may be disposed on an upper surface of the PDL 120. In one exemplary embodiment, the second pattern 134 may extend to a portion of the sidewall of the PDL 120. The first intermediate layer 136 may serve as an HTL of the OLED device. An HIL may be further disposed beneath the HTL.

As described with reference to FIG. 5, the first pattern 132 may include the above-mentioned hole transport material, and the second pattern 134 may include the above-mentioned cross-linked and/or polymerized photosensitive material in addition to the hole transport material.

In exemplary embodiments, the first intermediate layer 136 may further include a fluorine-containing layer 143 formed on the second pattern 134. The fluorine-containing layer 143 may include fluorine atoms, fluorine ions or fluorine-containing ions that may be diffused from the PDL 120 and/or the first intermediate layer 136, and may be fixed at an upper surface of the first intermediate layer 136.

The fluorine-containing layer 143 may be hydrophobic. The fluorine-containing layer 143 may have a relatively low surface energy and a relatively low ink-affinity. Thus, an EML 150 may be disposed selectively on the first pattern 132.

In some exemplary embodiments, a third electrode (not illustrated) may be further disposed on a second electrode 170 and a substrate 100. The third electrode may be electrically connected to a lead (not illustrated) that may be formed on a peripheral portion of the substrate 100 so as to be spaced apart from the first electrode 110.

A protection layer (not illustrated) and an upper substrate (not illustrated) may be sequentially disposed on the second electrode 170.

FIGS. 16 through 26 are perspective and cross-sectional views illustrating the organic light emitting display devices of FIG. 15.

FIGS. 16, 19, 21, 23 and 25 are perspective views illustrating exemplary embodiments of the OLED device of FIG. 15. For convenience of explanation, the EML 150, the second intermediate layer 160 and the second electrode 170 of FIG. 15 are not illustrated in these figures. Furthermore, the first intermediate layer 136 is illustrated to include an HIL 136a and an HTL 136b sequentially stacked on the substrate 100, the PDL 120 and the first electrode 110.

Figure 16:
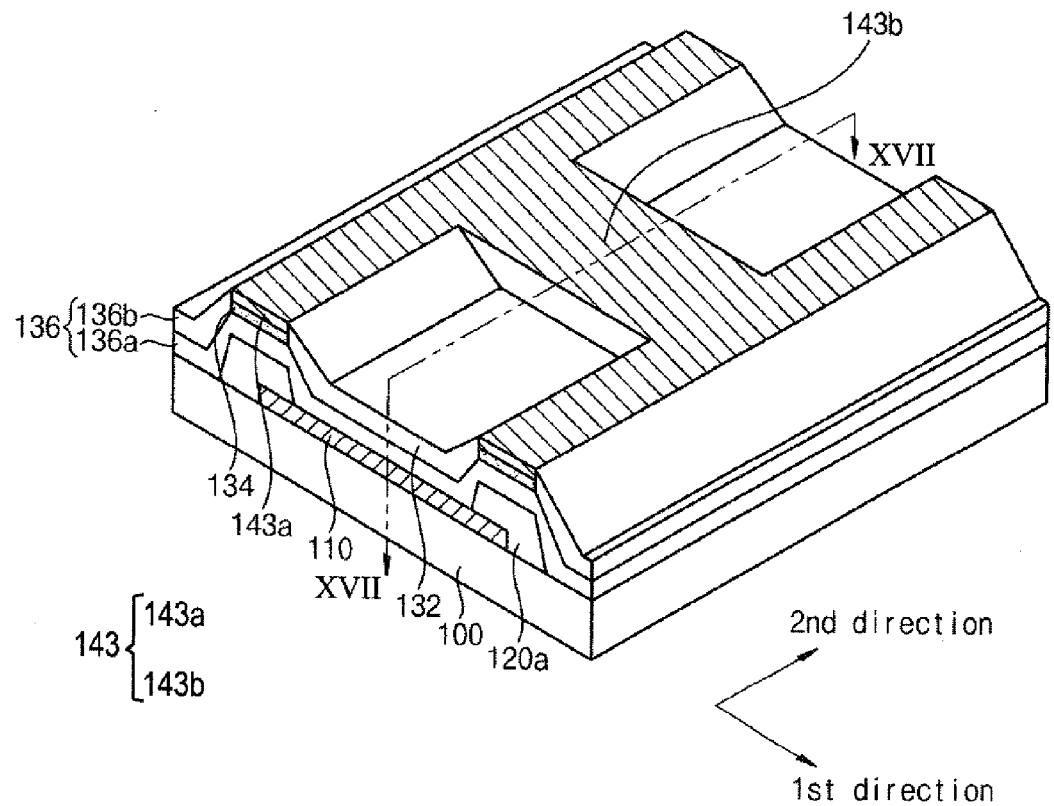
FIGS. 16 through 26 are perspective and cross-sectional views illustrating the organic light emitting display device of FIG. 15.
Figure 17:
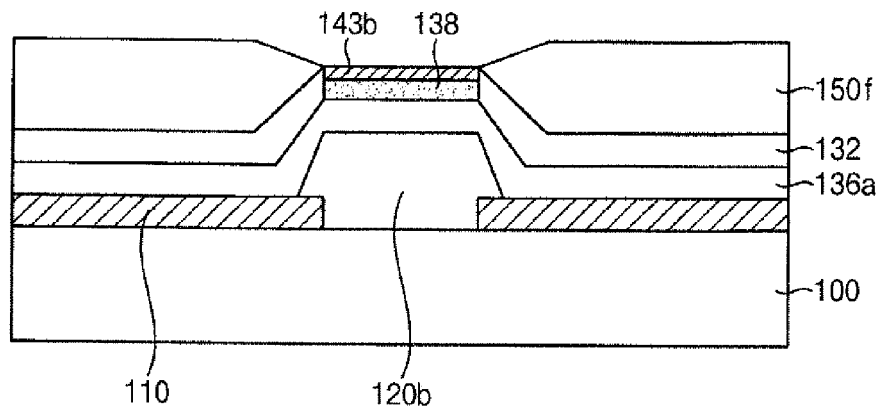
Figure 18:
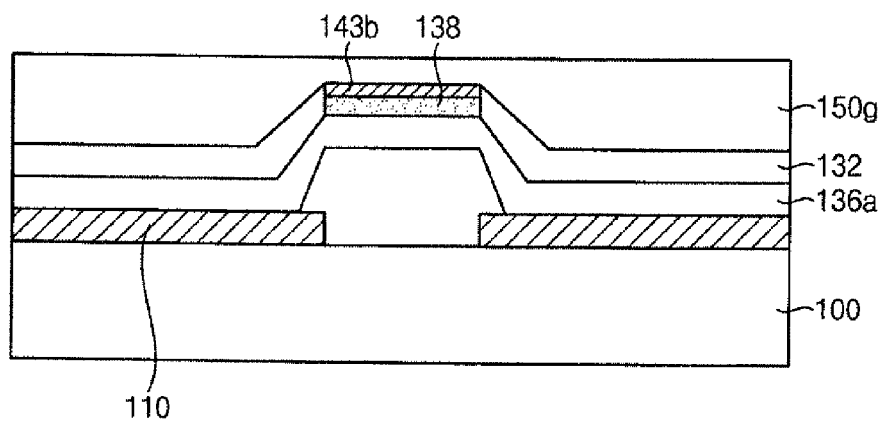

FIGS. 17 and 18 are cross-sectional views taken along a line XVII-XVII of FIG. 16. FIGS. 20, 22, 24 and 26 are cross-sectional views taken along lines XX-XX, XXII-XXII, XXIV-XXIV and XXVI-XXVI, respectively, of FIGS. 19, 21, 23 and 25, respectively.

Referring to FIGS. 16 and 17, a PDL 120 may have a substantially "H" shape. For example, the PDL 120 may include a plurality of first line patterns 120a (FIG. 16) extending in the second direction and a plurality of second line patterns 120b (FIG. 17) extending in the first direction. The first and second line patterns 120a and 120b, respectively, may meet each other to define pixel regions having lattice or grid structures.

The HTL 136b may include first, second and third patterns 132, 134 and 138, respectively. The second pattern 134 (FIG. 16) may substantially overlap an upper surface of the first line pattern 120a. The third pattern 138 (FIG. 17) may substantially overlap an upper surface of the second line pattern 120b. A remaining portion of the HTL 136b except for the second and third patterns 134 and 138, respectively, may be defined as the first pattern 132. The second and third patterns 134 and 138, respectively, may meet each other in a manner substantially the same as or similar to that of the first and second line patterns 120a and 120b, respectively. The third pattern 138 may substantially overlap a portion of a substrate 100 between adjacent first electrodes 100 spaced apart from each other in the second direction. The second and third patterns 134 and 138, respectively, may have upper surfaces substantially higher that that of the first pattern 132.

In exemplary embodiments, the third pattern 138 may have properties substantially the same as, or similar to, those of the second pattern 134. For example, the third pattern 138 may include the above-mentioned hole transport material and the above-mentioned cross-linked or polymerized photosensitive material. Thus, the third pattern 138 may have an electrical resistance substantially greater than that of the first pattern 132 or an electrical conductivity substantially less than that of the first pattern 132. Furthermore, the third pattern 138 may have a surface energy substantially less than that of the first pattern 132.

A fluorine-containing layer 143 (FIG. 16) may include a first fluorine-containing layer 143a and a second fluorine-containing layer 143b. The first fluorine-containing layer 143a may be disposed on the second pattern 134, and the second fluorine-containing layer 143b may be disposed on the third pattern 138. The first and second fluorine-containing layers 143a and 143b, respectively, may meet each other in a manner substantially the same as, or similar to, that of the first and second line patterns 120a and 120b, respectively. The first fluorine-containing layer 143a may include fluorine atoms, fluorine ions or fluorine-containing ions that may be diffused from the first line pattern 120a and/or the second pattern 134. The second fluorine-containing layer 143b may include fluorine atoms, fluorine ions or fluorine-containing ions that may be diffused from the second line pattern 120b and/or the third pattern 138.

As illustrated in FIG. 17, an EML 150f may be disposed on the first pattern 132, and may be separated in the second direction by the second fluorine-containing layer 143b. The EML 150f may be separated in the first direction by the first fluorine-containing layer 143a. In exemplary embodiments, the EML 150f may have an island shape confined by the first and second fluorine-containing layers 143a and 143b, respectively, that may have hydrophobicity, a relatively low ink-affinity, a relatively low surface energy, etc.

As illustrated in FIG. 18, an EML 150g may continuously extend on the first pattern 132 and the second fluorine-containing layer 143b in the second direction. In this case, the EML 150g may be separated in the first direction by the first fluorine-containing layer 143a.

Figure 19:
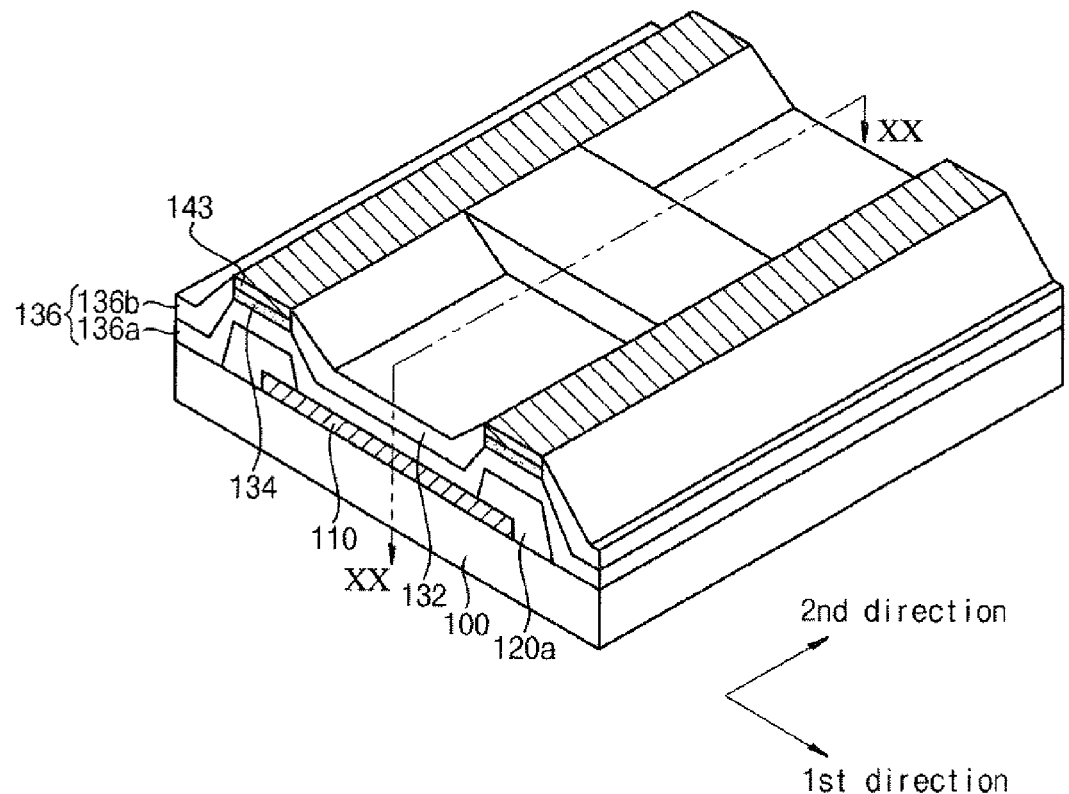
Figure 20:
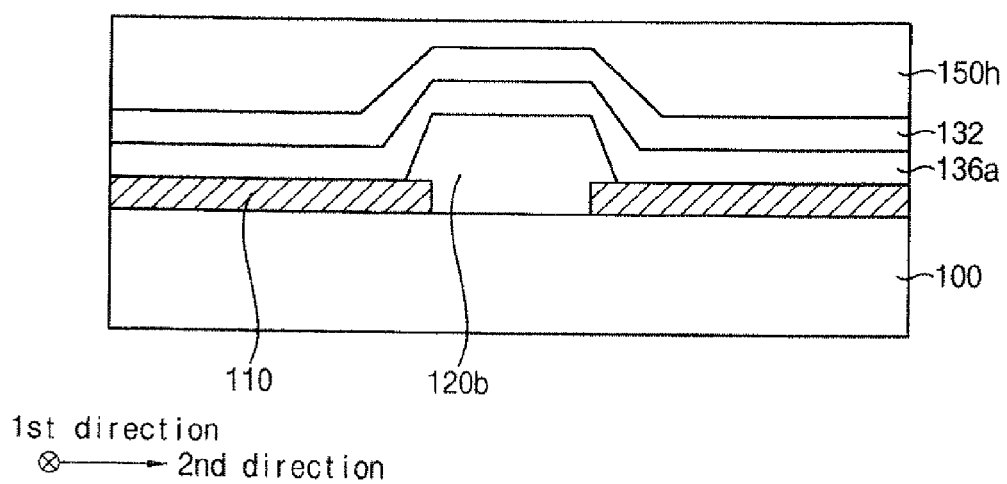

Referring to FIGS. 19 and 20, the third pattern 138 and the second fluorine-containing layer 143b (of FIG. 18) may not be formed on the second line pattern 120b (FIG. 20) of the PDL 120. In this case, a second pattern 134 (FIG. 19) may substantially overlap the upper surface of the first line pattern 120a, and a remaining portion of the HTL 136b, except for the second pattern 134, may be defined as a first pattern 132. A fluorine-containing layer 143 may be disposed on the second pattern 134, and may have a line shape or a bar shape extending in the first direction. In this case, an EML 150h (FIG. 20) may continuously extend on the first pattern 132 in the second direction. The EML 150h may be separated in the first direction by the fluorine-containing layer 143.

Figure 21:
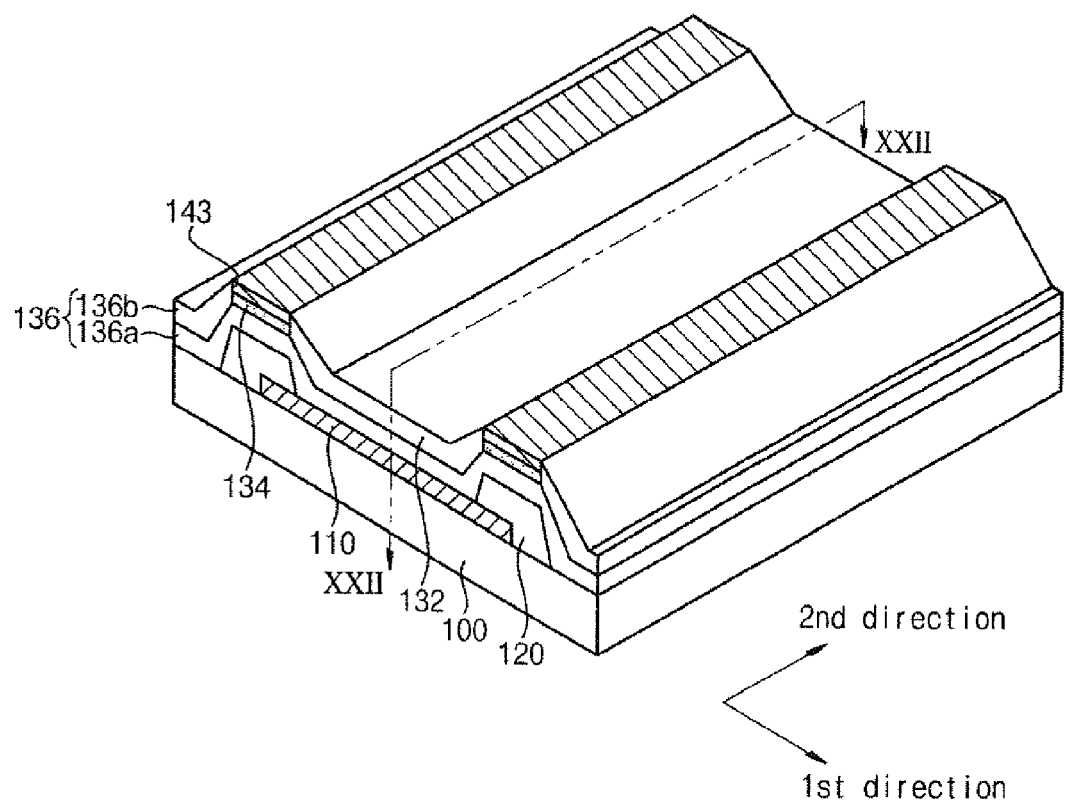
Figure 22:
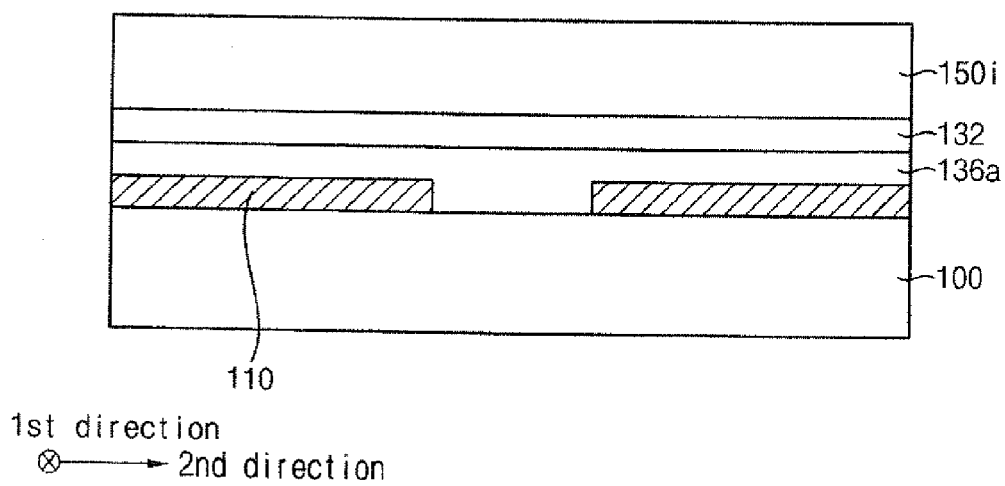

Referring to FIGS. 21 and 22, a PDL 120 may have a linear shape or a bar shape extending in the second direction. The HTL 136b may include a first pattern 132, a second pattern 134 and a fluorine-containing layer 143. The second pattern 134 may substantially overlap an upper surface of the PDL 120. The fluorine-containing layer 143 may be disposed on the second pattern 134. A remaining portion of the HTL 136b, except for the second pattern 134 and the fluorine-containing layer 143, may be defined as the first pattern 132. As illustrated in FIG. 22, an EML 150i may have a linear shape extending on the first pattern 132 in the second direction. The EML 150i may be separated in the first direction by the fluorine-containing layer 143.

Figure 23:
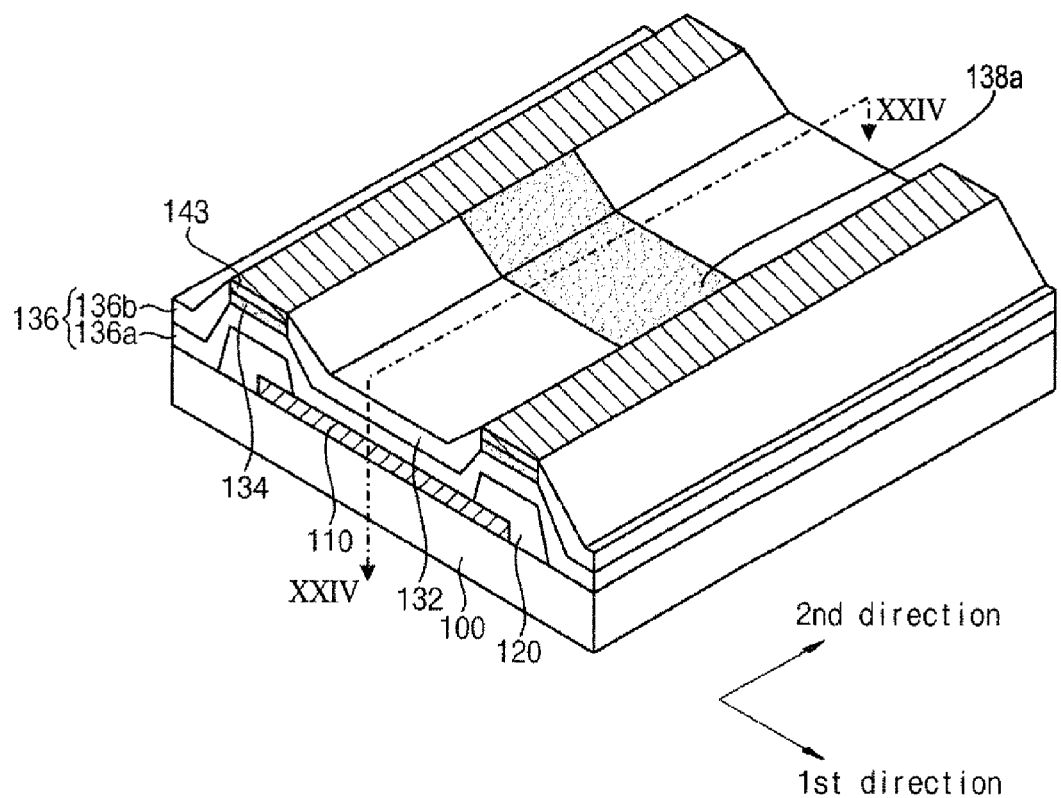
Figure 24:
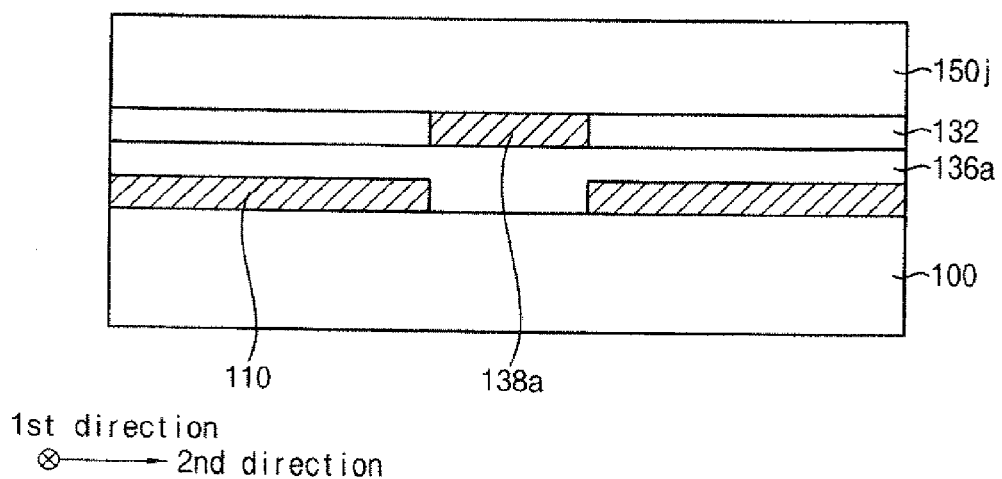

Referring to FIGS. 23 and 24, a PDL 120 may have a linear shape or a bar shape extending in the second direction as illustrated in FIG. 21. The HTL 136b may include first, second and third patterns 132, 134 and 138a, respectively. The second pattern 134 may substantially overlap an upper surface of the PDL 120, and have a linear shape extending in the second direction. A fluorine-containing layer 143 may be disposed on the second pattern 134. The third pattern 138a may have a linear shape extending in the first direction. The third pattern 138a may substantially overlap a portion of a substrate 100 between adjacent first electrodes 110 spaced apart from each other in the second direction. A remaining portion of the HTL 136b, except for the second pattern 134, the third pattern 138a and the fluorine-containing layer 143, may be defined as the first pattern 132.

The third pattern 138a may have an upper surface substantially lower than that of the second pattern 134. The upper surface of the third pattern 138a may be substantially coplanar with that of the first pattern 132. In exemplary embodiments, the third pattern 138a may have properties substantially the same as, or similar to, those of the second pattern 134. For example, the third pattern 138a may include the above-mentioned hole transport material and the above-mentioned cross-linked or polymerized photosensitive material. Thus, the third pattern 138a may have an electrical resistance substantially greater than that of the first pattern 132 or an electrical conductivity substantially less than that of the first pattern 132. Furthermore, the third pattern 138a may have a surface energy substantially less than that of the first pattern 132. In this case, an EML 150j (FIG. 24) may have a linear shape extending on the first pattern 132 and the third pattern 138a in the second direction. The EML 150j may be separated in the first direction by the fluorine-containing layer 143.

Figure 25:
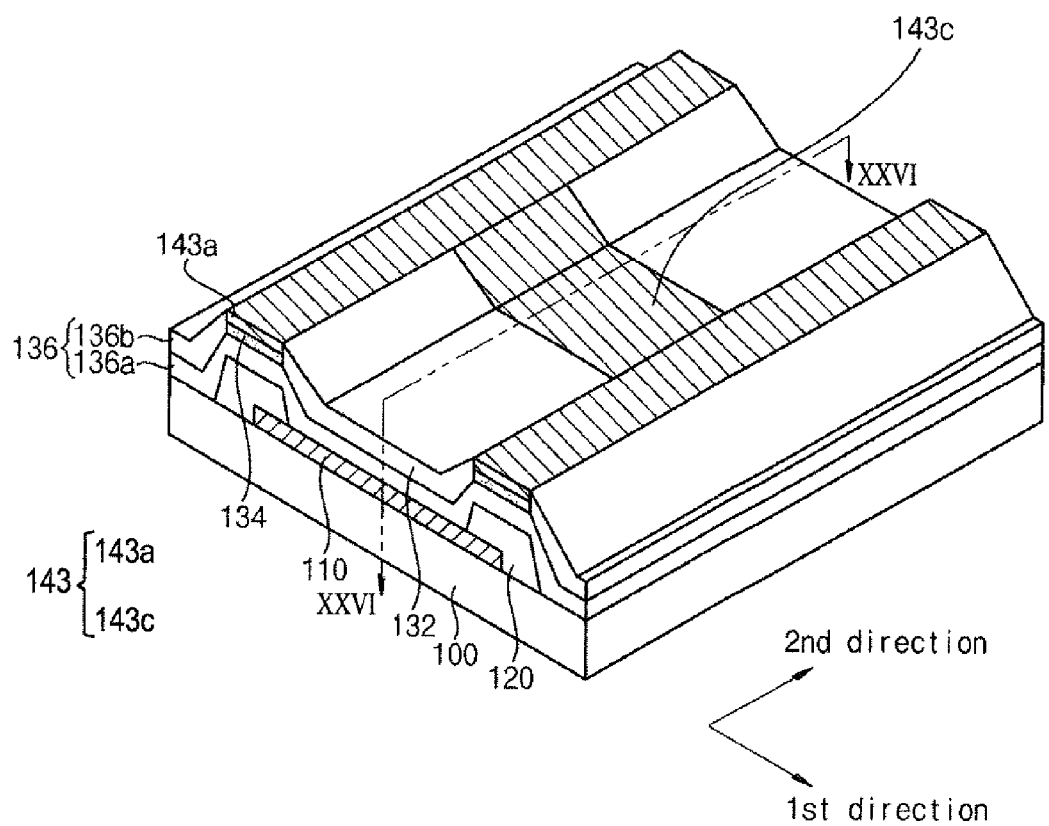
Figure 26:
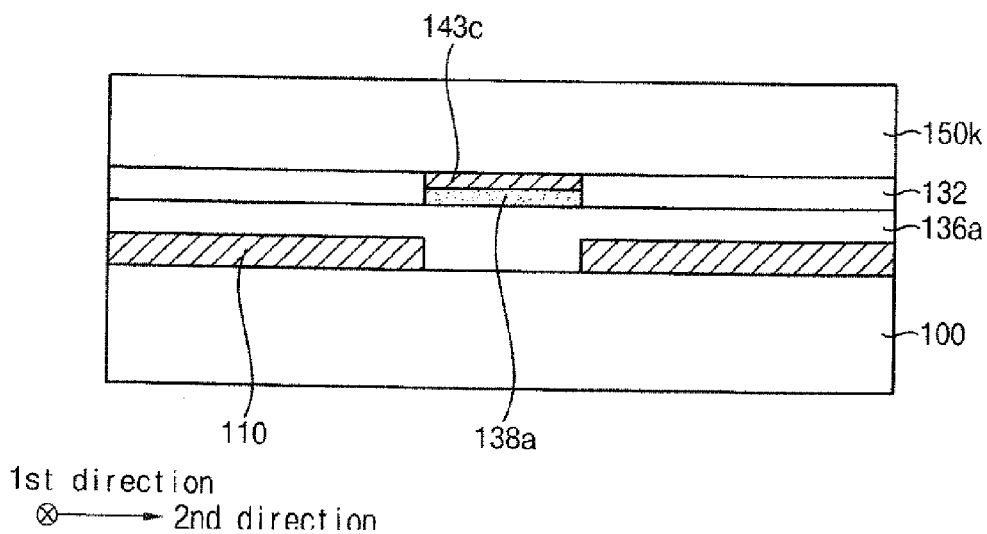

Referring to FIGS. 25 and 26, the OLED device of FIG. 25 may have a construction substantially the same as, or similar to, that of FIG. 23 except for the shape of the fluorine-containing layer. Specifically, a fluorine-containing layer 143 may include a first fluorine-containing layer 143a extending in the second direction on a second pattern 134, and a second fluorine-containing layer 143c extending in the first direction on a third pattern 138a.

In exemplary embodiments, the first fluorine-containing layer 143a may include fluorine atoms, fluorine ions or fluorine-containing ions that may be diffused from a PDL 120 and/or an HTL 136b. The second fluorine-containing layer 143c may include fluorine atoms, fluorine ions or fluorine-containing ions that may be diffused from the HTL 136b. In this case, an EML 150k (FIG. 26) may have a linear shape extending on a first pattern 132 and the second fluorine-containing layer 143c along the second direction.

Hereinafter, methods of manufacturing the OLED devices illustrated with reference to FIGS. 1 through 26 will be described.

FIGS. 27 through 33 are cross-sectional views illustrating a method of manufacturing an organic light emitting display device in accordance with exemplary embodiments of the invention. Specifically, FIGS. 27 through 33 illustrate a method of manufacturing the OLED device of FIGS. 1 through 4.

Figure 27:
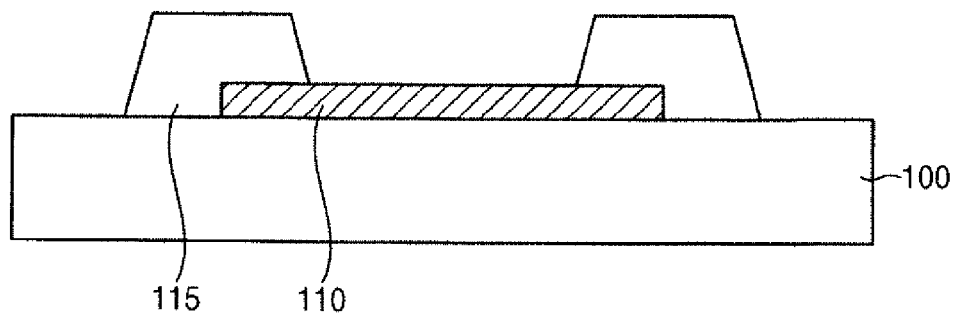
FIGS. 27 through 33 are cross-sectional views illustrating a method of manufacturing an organic light emitting display device in accordance with exemplary embodiments of the invention.

Referring to FIG. 27, a first electrode 110 may be formed on a substrate 100, and a preliminary PDL 115 partially exposing the first electrode 110 may be formed on the substrate 100.

The substrate 100 may include a lower substrate (not illustrated) and lower structures (not illustrated) formed on the lower substrate. The lower structures may include, e.g., a switching device, an insulation layer covering the switching device, etc.

The switching device may include a TFT having a semiconductor layer, a gate insulation layer, a gate electrode, a source electrode and a drain electrode, etc. Alternatively, the switching device may include an oxide semiconductor device having a gate electrode, a gate insulation layer and an active layer of a semiconductor oxide.

The first electrode 110 may be formed using a transparent conductive material such as indium tin oxide (ITO), zinc tin oxide (ZTO), indium oxide (InOx), indium zinc oxide (IZO), zinc oxide ($ZnO_x$), tin oxide ($SnO_x$), gallium zinc oxide (GZO), gallium indium zinc oxide (GIZO), aluminum-doped zinc oxide (AZO), etc., or the first electrode 110 may be formed using a metal such as silver (Ag), aluminum (Al), platinum (Pt), gold (Au), chromium (Cr), tungsten (W), molybdenum (Mo), titanium (Ti), palladium (Pd), neodymium (Nd), etc., and/or an alloy of these metals. The first electrode 110 may be obtained by a sputtering process, a chemical vapor deposition (CVD) process, an atomic layer deposition (ALD) process, a pulse laser deposition (PLD) process, a vacuum evaporation process, a printing process, etc. In some exemplary embodiments, the first electrode 110 may have a multi-stacked structure including a transparent conductive layer and a metal layer.

In exemplary embodiments, a plurality of the first electrodes 110 may be formed so as to be spaced apart from each other in a first direction. Additionally, a plurality of the first electrodes 110 may be formed so as to be spaced apart from each other in a second direction substantially perpendicular to the first direction. The first electrode 110 may be electrically connected to the drain electrode of the switching device.

The preliminary PDL 115 may be formed using molecules containing carbon-fluorine bonds (hereinafter, referred to as a carbon-fluorine combined molecule). The carbon-fluorine combined molecule may include a $CF_1$ molecule in which one carbon atom is combined with one fluorine atom, a $CF_2$ molecule in which one carbon atom is combined with two fluorine atoms, a $CF_3$ molecule in which one carbon atom is combined with three fluorine atoms, a $CF_4$ molecule in which one carbon atom is combined with four fluorine atoms, etc. Examples of the $CF_1$, $CF_2$, $CF_3$ and $CF_4$ molecules may include $CH_3F$, $CH_2F_2$, $CHF_3$, $CF_4$, respectively. These may be used alone or in a mixture thereof.

In exemplary embodiments, a carbon-fluorine containing layer (not illustrated) may be formed on the substrate 100 and the first electrode 110 using the carbon-fluorine combined molecule by, e.g., a plasma enhanced chemical vapor deposition (PECVD) process. The carbon-fluorine continuing layer may be patterned by, e.g., an etching process so as to form the preliminary PDL 115. The carbon-fluorine containing layer may include a polymer in which fluorine atoms are combined with a carbon-carbon backbone.

In exemplary embodiments, the preliminary PDL 115 may be patterned so as to have a substantially "H" shape. For example, the preliminary PDL 115 may include a plurality of first line patterns (not illustrated) extending in the second direction and a plurality of second line patterns (not illustrated) extending in the first direction. In this case, the first and second line patterns may cross each other. Alternatively, the preliminary PDL 115 may have a linear shape or a bar shape extending in the second direction.

Figure 28:
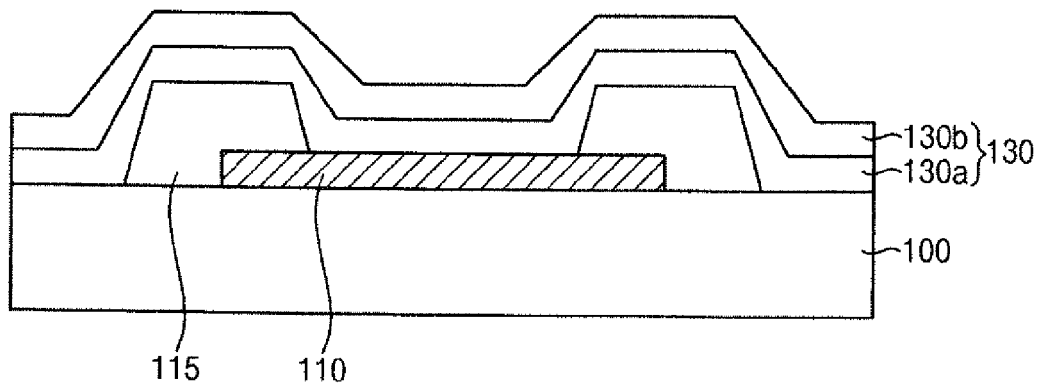

Referring to FIG. 28, a first intermediate layer 130 covering the preliminary PDL 115 and the first electrode 110 may be formed on the substrate 100. In exemplary embodiments, the first intermediate layer 130 may include a HIL 130a and a HTL 130b sequentially stacked on the substrate 100, the preliminary PDL 115 and the first electrode 110.

The HIL 130a may be formed using a hole injection material, e.g., CuPc, PEDOT, PANI, etc. The HTL 130b may be formed using a hole transport material, e.g., NPB, TPD, NPD, N-phenylcarbazole, polyvinylcarbazole, etc. The HIL 130a and the HTL 130b may be coated or whole surface-deposited on the substrate 100, the preliminary PDL 115 and the first electrode 110 by a spin coating process, a roll coating process, a vacuum evaporation process, a thermal evaporation process, etc.

Figure 29:
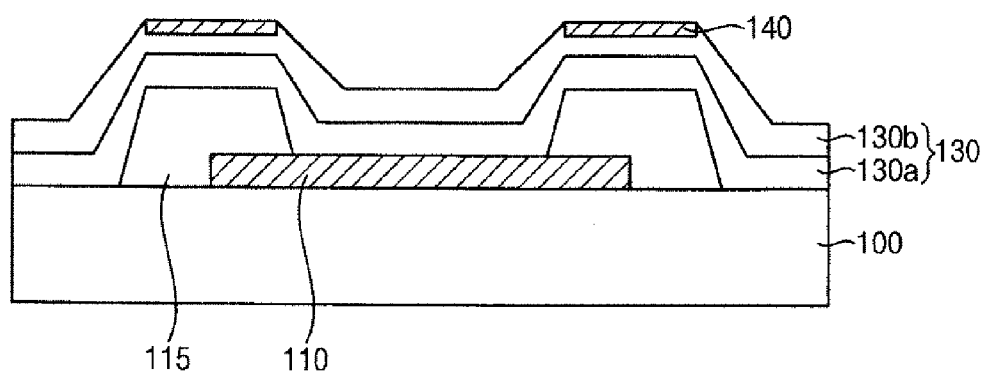

Referring to FIG. 29, an exposure process using, e.g., an ultraviolet light source may be performed selectively on a region substantially overlapping an upper surface of the preliminary PDL 115. Accordingly, a fluorine-containing layer 140 may be formed at an upper surface of the HTL 130b substantially overlapping the upper surface of the preliminary PDL 115, and the preliminary PDL 115 may be transformed into a PDL 120.

In exemplary embodiments, the ultraviolet light source may emit an ultraviolet light having a wavelength in a range of about 180 nm to about 260 nm. During the exposure process, fluorine atoms, fluorine ions and/or fluorine-containing ions may be separated or detached from the carbon-carbon backbone included in the preliminary PDL 115 so as to be diffused to an upper portion of the first intermediate layer 130 substantially overlapping the upper surface of the preliminary PDL 115. The diffused fluorine atoms, the fluorine ions and/or the fluorine-containing ions may be fixed at the upper surface of the HTL 130b by the ultraviolet light so as to form the fluorine-containing layer 140. The preliminary PDL 115 from which the fluorine atoms, the fluorine ions and/or the fluorine-containing ions are removed may be transformed into the PDL 120. In exemplary embodiments, the PDL 120 may include a polymer having repetitive carbon-carbon chains. Accordingly, the PDL 120 may serve as an insulator. In the case wherein the OLED device is operated according to a back-emission type, the PDL 120 may function as a black matrix.

In exemplary embodiments, the fluorine-containing layer 140 may substantially overlap an upper surface of the PDL 120. In some exemplary embodiments, the fluorine-containing layer 140 may partially overlap a sidewall of the PDL 120.

The fluorine atoms, the fluorine ions and/or the fluorine-containing ions separated from the preliminary PDL 115 may be diffused laterally through a sidewall of the preliminary PDL 115 to a portion of the first intermediate layer 130 substantially overlapping the first electrode 110. However, these laterally diffused fluorine atoms, the fluorine ions and/or the fluorine-containing ions may not be fixed by the ultraviolet light so that they are removed by evaporation. In one exemplary embodiment, a thermal treatment may be further performed to remove the laterally diffused fluorine atoms, the fluorine ions and/or the fluorine-containing ions.

Referring now to FIGS. 2 and 3, the PDL 120 may have a substantially "H" shape. For example, the PDL 120 may include a plurality of first line patterns 120a (FIG. 2) extending in the second direction and a plurality of second line patterns 120b (FIG. 3) extending in the first direction. The first and second line patterns 120a and 120b, respectively, may meet each other to define pixel regions having lattice or grid structures.

In this case, the exposure process may be carried out by a mask including an "H"-shaped transparent portion that may substantially overlap an upper surface of the PDL 120. Accordingly, a first fluorine-containing layer 140a (FIG. 2) may be formed on a portion of the upper surface of the HTL 130b substantially overlapping the first line pattern 120a, and a second fluorine-containing layer 140b (FIGS. 2 and 3) may be formed on a portion of the upper surface of the HTL 130b substantially overlapping the second line pattern 120b. The first and second fluorine-containing layers 140a and 140b, respectively, may meet each other in a manner substantially the same as, or similar to, that of the first and second line patterns 120a and 120b, respectively. Hereinafter, a portion of the upper surface of the HTL 130b not including the fluorine-containing layer is referred to as a first surface. A portion of the upper surface of the HTL 130b including the first fluorine-containing layer 140a is referred to as a second surface. A portion of the upper surface of the HTL 130b including the second fluorine-containing layer 140b is referred to as a third surface. In exemplary embodiments, the second and third surfaces may be hydrophobic with respect to the first pattern. Additionally, the second and third surfaces may have ink-affinities substantially less than that of the first surface.

In some exemplary embodiments, the exposure process may be carried out by a mask including a line-shaped transparent portion substantially overlapping an upper surface of the first line pattern 120a. In this case, the fluorine-containing layer 140 may be formed only over the first line pattern 120a. For example, the second fluorine-containing layer 140b of FIG. 2 may not be formed. An upper surface of the HTL 130b may be divided into a second surface including the fluorine-containing layer 140 and a first surface not including the fluorine-containing layer 140.

Referring now to FIG. 4, the PDL 120 may have a linear shape substantially extending in the second direction. The exposure process may be carried out by a mask including a line-shaped transparent portion substantially overlapping an upper surface of the PDL 120. Accordingly, the fluorine-containing layer 140 may be formed on a portion of an upper surface of the HTL 130b substantially overlapping the upper surface of the PDL 120. In this case, the upper surface of the HTL 130b may be divided into a second surface including the fluorine-containing layer 140 and a first surface not including the fluorine-containing layer 140.

Figure 30:
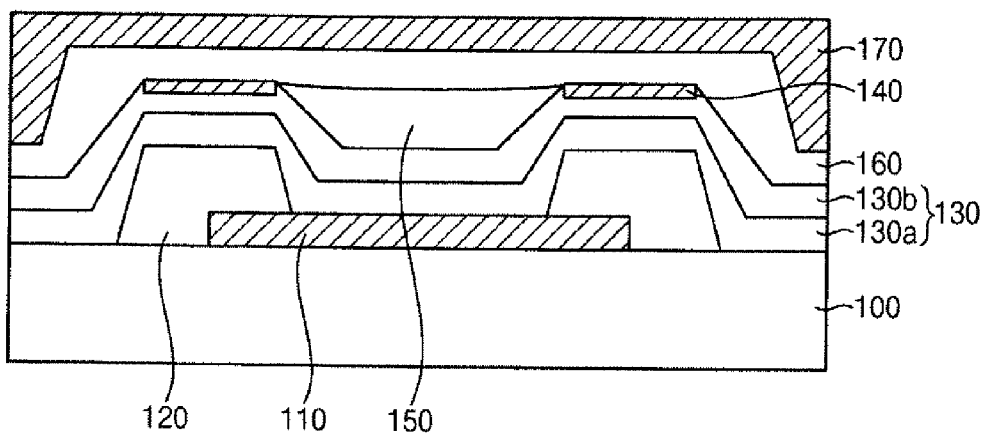

Referring to FIG. 30, an EML 150 may be formed on a portion of the HTL 130b not including the fluorine-containing layer 140. The EML 150 may be formed using at least one of light emitting materials for generating different colors of light, for example, a red color of light, a green color of light and/or a blue color of light. The EML 150 may be formed using a mixture or a combination of the light emitting materials for generating a white color of light. In one exemplary embodiment, the light emitting materials may serve as dopant materials of the EML 150. In this case, the EML 150 may further include a host material having a relatively large band gap. Suitable dopant and host materials may be selected in accordance with a light-emitting mechanism of the EML 150, for example, a fluorescent mechanism or a phosphorescent mechanism. The EML 150 may be obtained by a nozzle printing process, an inkjet printing process, a transfer process through heat or laser, etc.

Referring now to FIGS. 2 and 3, the EML 150 may be formed by, e.g., an inkjet printing process. In this case, the second and third surfaces, including the fluorine-containing layers 140a and 140b, may have relatively low ink-affinities so that the EML 150 may be formed selectively on the first surface not including the fluorine-containing layer. Furthermore, the first surface may be substantially lower than the second and third surfaces so that the EML 150 may be formed selectively on the first surface by gravity. Therefore, blurring or smearing of ink onto a non-pixel region may be prevented so that the OLED device may have improved resolution or contrast.

Meanwhile, in the case wherein the fluorine-containing layer is not formed over the second line pattern 120b, the EML 150 may be formed by, e.g., a nozzle printing process. In this case, the EML 150 may be formed on the first surface not including the first fluorine-containing layer 140 so as to extend in the second direction.

As illustrated in FIG. 4, in the case wherein the PDL may have a substantially linear shape extending in the second direction, the EML 150 may be formed by, e.g., a nozzle printing process. In this case, the EML 150 may be formed on the first surface not including the first fluorine-containing layer 140 so as to extend in the second direction.

Referring now to FIG. 30, a second intermediate layer 160 may be formed on the HTL 130b, the EML 150 and the fluorine-containing layer 140. The second intermediate layer 160 may be obtained by a vacuum deposition process, a thermal evaporation process, a slit coating process, a spin coating process, a printing process, etc.

The second intermediate layer 160 may include an ETL. The ETL may be formed using, e.g., Alq$_3$, PBD, BAlq, BCP, etc. These may be used alone or in a mixture thereof. The second intermediate layer 160 may further include an EIL formed on the ETL. The EIL may be formed using, e.g., an alkaline metal, an alkaline earth metal, fluorides of these metals, oxides of these metals, etc.

A second electrode 170 may be formed on the second intermediate layer 160. The second electrode 170 may be formed using a transparent conductive material such as indium tin oxide, zinc tin oxide, indium oxide, indium zinc oxide, zinc oxide, tin oxide, gallium zinc oxide, gallium indium zinc oxide, aluminum-doped zinc oxide, etc., or the second electrode 170 may be formed using a metal such as silver, aluminum, platinum, gold, chromium, tungsten, molybdenum, titanium, palladium, neodymium, etc., and/or an alloy of these metals. The second electrode 170 may be obtained by a sputtering process, a CVD process, an ALD process, a PLD process, a vacuum evaporation process, a printing process, etc. In some exemplary embodiments, the second electrode 170 may have a multi-stacked structure including a transparent conductive layer and a metal layer. The second electrode 170 may serve as a cathode providing electrons into the second intermediate layer 160.

A protection layer (not illustrated) and an upper substrate (not illustrated) may be formed on the second electrode 170 so as to obtain the OLED device according to exemplary embodiments. In some exemplary embodiments, a third electrode electrically connected to a lead formed on a peripheral portion of the substrate 100 may be further formed on the second electrode 170.

Figure 31:
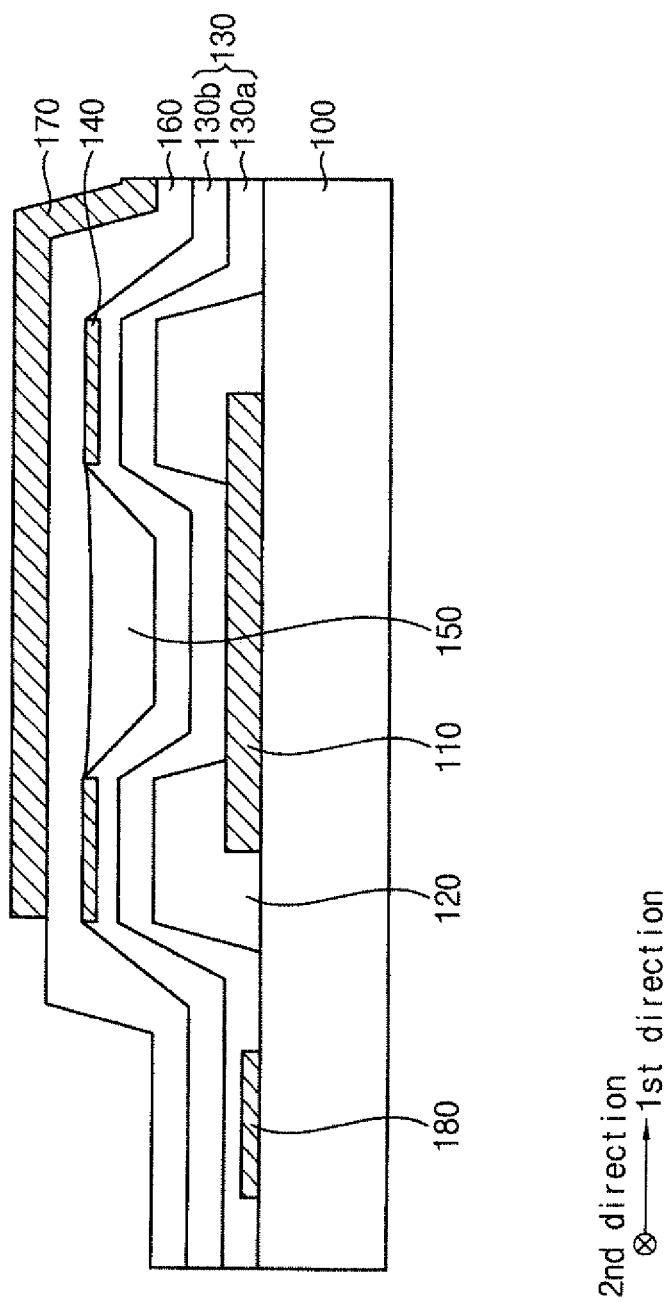

Referring to FIG. 31, a lead 180 spaced apart from the first electrode 110 and the PDL 120 may be formed on a peripheral portion of the substrate 100. The lead 180 may be electrically connected to a wiring (not illustrated) formed in the substrate 100.

In exemplary embodiments, the lead 180 may be formed simultaneously with the first electrode 110 during an etching process for forming the first electrode 110. The second electrode 170 may be formed on the second intermediate layer 160 so as to substantially overlap the first electrode 110 and so as not to substantially overlap the lead 180.

Figure 32:
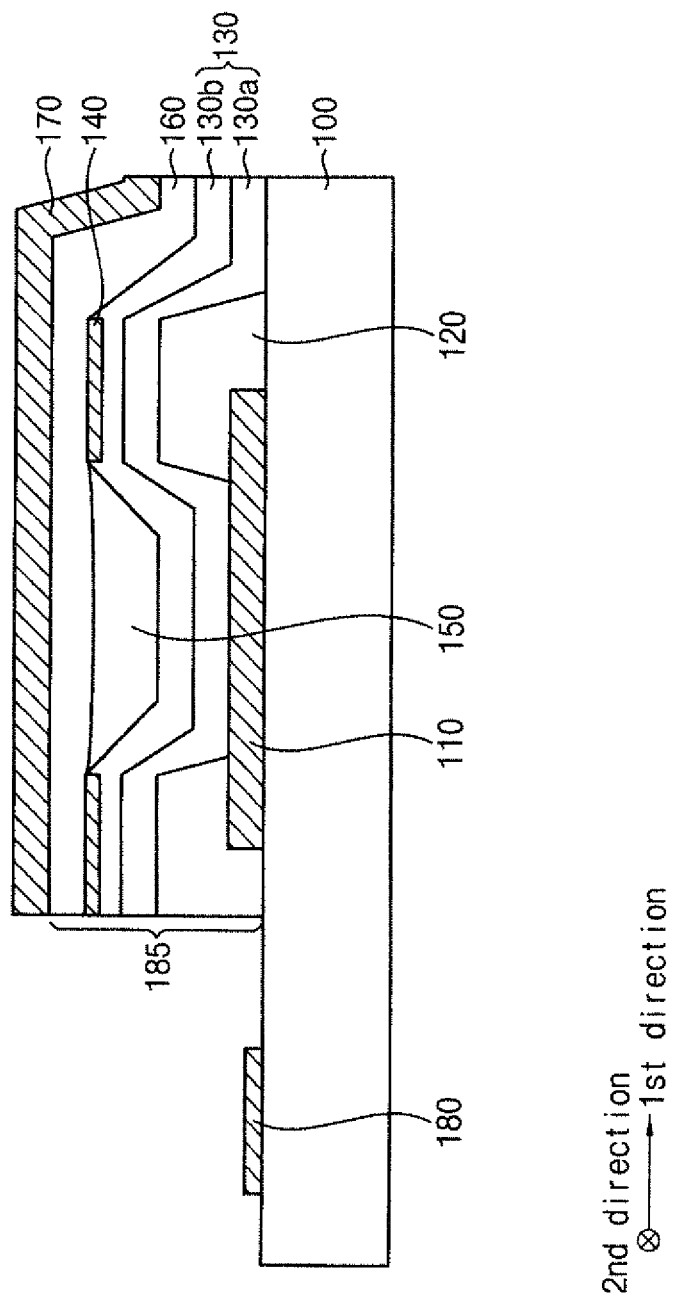

Referring to FIG. 32, the second intermediate layer 160, the fluorine-containing layer 140, the first intermediate layer 130 and the PDL 120 may be sequentially etched using the second electrode 170 as an etching mask. Accordingly, the lead 180 on the substrate 100 may be exposed. Additionally, an insulation layer pattern 185 including the etched second intermediate layer 160, the fluorine-containing layer 140, the first intermediate layer 130 and the PDL 120 may be formed. In exemplary embodiments, the etching process may include a dry etching process using, e.g., oxygen ($O_2$) plasma.

Figure 33:
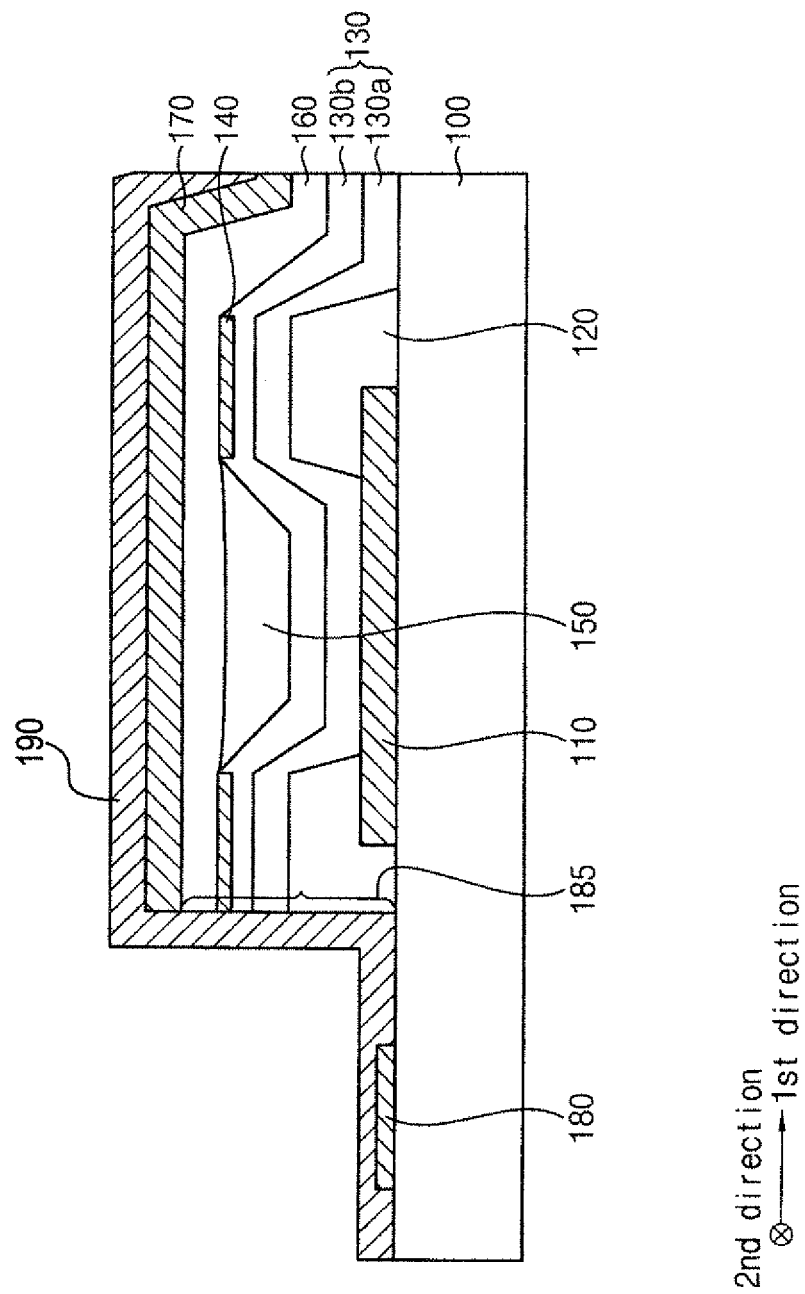

Referring to FIG. 33, a third electrode 190 may be formed on the substrate 100, an etched surface of the insulation layer pattern 185 and the second electrode 180. The third electrode 190 may be formed using a material substantially the same as, or similar to, that of the second electrode 170. The third electrode 190 may be obtained by a sputtering process, a CVD process, an ALD process, a vacuum deposition process, a PLD process, a printing process, etc. The third electrode 190 may also serve as a cathode and may be electrically connected to the lead 180 on the substrate 100. The insulation layer pattern 185 may intervene between the first electrode 110 and the third electrode 190. Thus, a short-circuit between the first electrode 110 and the third electrode 190 may be prevented.

Figure 34:
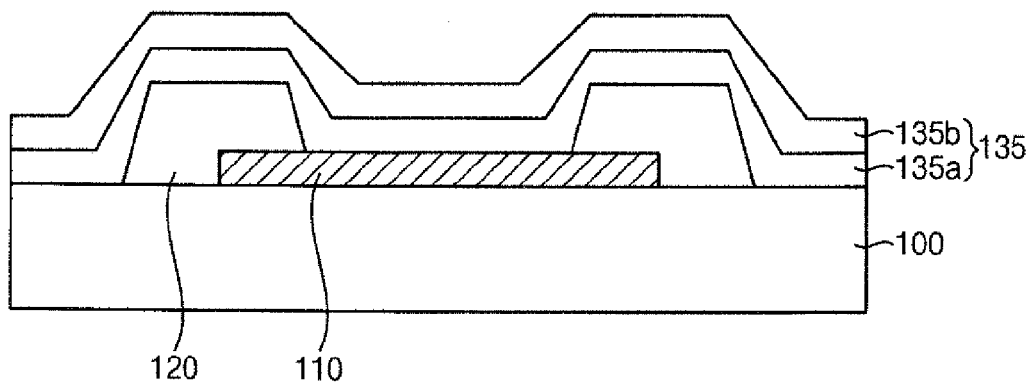
FIGS. 34 through 36 are cross-sectional views illustrating a method of manufacturing an organic light emitting display device in accordance with some exemplary embodiments of the invention.
Figure 35:
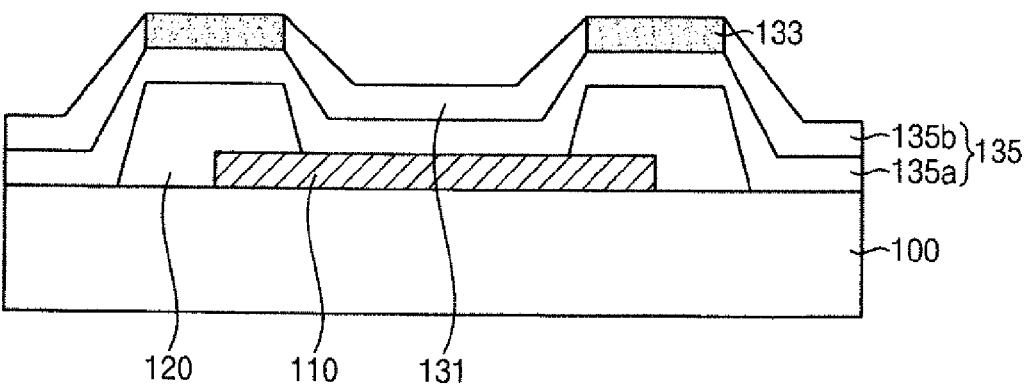
Figure 36:
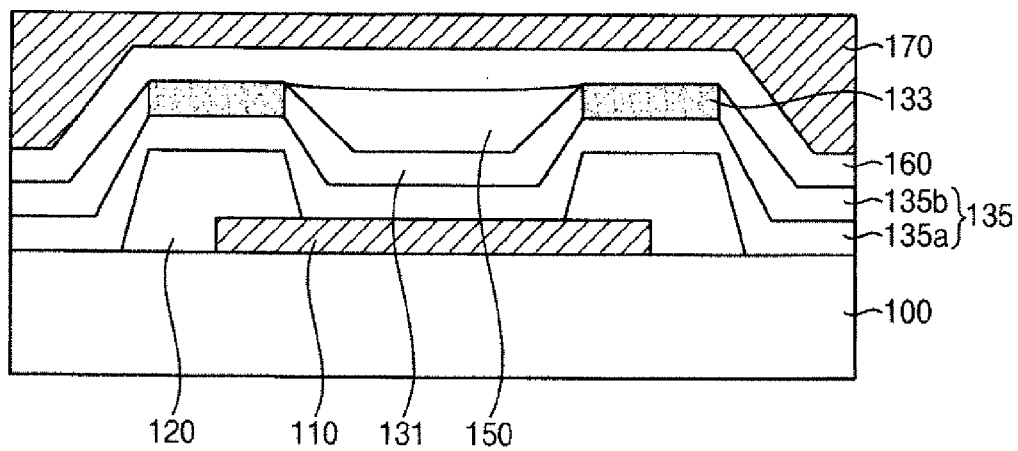

FIGS. 34 through 36 are cross-sectional views illustrating a method of manufacturing an organic light emitting display device in accordance with some exemplary embodiments of the invention. For example, FIGS. 34 through 36 illustrate a method of manufacturing the OLED devices of FIGS. 5 through 14. Detailed descriptions on processes substantially the same as, or similar to, those illustrated with reference to FIGS. 27 through 33 are omitted.

Referring to FIG. 34, a first electrode 110 may be formed on a substrate 100, and a PDL 120 partially exposing the first electrode 110 may be formed on the substrate 100. A first intermediate layer 135 covering the PDL 120 and the first electrode 110 may be formed on the substrate 100. In exemplary embodiments, the first intermediate layer 135 may include an HIL 135a and an HTL 135b sequentially stacked on the substrate 100, the PDL 120 and the first electrode 110.

The PDL 120 may be formed using a photosensitive material such as acryl-based resin, polyimide, benzocyclobutene, etc. For example, the photosensitive material may be deposited on the substrate 100 and the first electrode 110, and then exposure and developing processes may be performed to form the PDL 120. In exemplary embodiments, the PDL 120 may have a substantially "H"-shape as illustrated in FIGS. 6 through 10. For example, the PDL 120 may include a plurality of first line patterns 120a extending in the second direction and a plurality of second line patterns 120b extending in the first direction. In this case, the first and second line patterns 120a and 120b, respectively, may cross each other. Alternatively, the PDL 120 may have a linear shape or a bar shape extending in the second direction as illustrated in FIGS. 11 through 14.

Referring now to FIG. 34, the HTL 135b may be formed using a photosensitive composition that may include the above-mentioned hole transport material and the above-mentioned photosensitive material. In exemplary embodiments, the photosensitive composition may further include a photoinitiator. The photoinitiator may be a compound that may produce active species initiating cross-linking and/or polymerization reactions of the photosensitive material during an exposure process. Examples of the photoinitiator may include acetophenon derivatives, benzophenon derivatives, triazine derivatives, biimidazole-based or oxime ester-based materials, etc. These may be used alone or in a mixture thereof.

Referring to FIG. 35, an exposure process using, e.g., an ultraviolet light source may be performed selectively on a region substantially overlapping an upper surface of the PDL 120. Accordingly, the HTL 135b may be transformed into a first pattern 131 and a second pattern 133. In exemplary embodiments, a portion of the HTL 135b substantially overlapping the upper surface of the PDL 120 may be transformed into the second pattern 133. A remaining portion of the HTL 135b that may not be transformed into the second pattern 133 may be defined as the first pattern 131.

In exemplary embodiments, the cross-linking and/or polymerization reactions of the photosensitive material may be induced at the portion of the HTL 135h selectively exposed to light. Thus, the second pattern 133 may include a cross-linked and/or polymerized photosensitive material in addition to the hole transport material. Accordingly, the second pattern 133 may have an electrical conductivity substantially lesser than that of the first pattern 131 or an electrical resistance substantially greater than that of the first pattern 131. Additionally, the second pattern 133 may have a surface energy substantially less than that of the first pattern 131. Therefore, an EML 150 may be formed selectively on the first pattern 131 by a subsequent process, and lateral diffusion of charges may be blocked by the second pattern 133 to thereby prevent crosstalk between adjacent pixel regions.

In exemplary embodiments, a thermal treatment may be additionally performed so that the photosensitive material and/or the photoinitiator remaining in the first pattern 131 may be removed by evaporation.

Referring now to FIG. 6, the PDL 120 may have a substantially "H" shape. In this case, the exposure process may be carried out by a mask including an "H"-shaped transparent portion that may substantially overlap the upper surface of the PDL 120. Accordingly, a portion of the HTL 135b substantially overlapping an upper surface of the first line pattern 120a may be transformed into the second pattern 133, and a portion of the HTL 135b substantially overlapping an upper surface of the second line pattern 120b (FIG. 7) may be transformed into a third pattern 137. The second and third line patterns 133 and 137, respectively, may cross each other in a manner substantially the same as, or similar to, that of the first and second line patterns 120a and 120b, respectively. In exemplary embodiments, the third pattern 137 may have electrical and surface properties substantially the same as, or similar to, those of the second pattern 133. The second and third patterns 133 and 137, respectively, may have upper surfaces substantially higher than that of the first pattern 131.

Referring now to FIG. 9, the exposure process may be carried out by a mask including a line-shaped transparent portion substantially overlapping the upper surface of the first line pattern 120a. In this case, the third pattern 137 illustrated in FIG. 6 may not be formed. For example, the second pattern 133 substantially overlapping the upper surface of the first line pattern 120a may be formed. A remaining portion of the HTL 135b, except for the second pattern 133, may be defined as the first pattern 131.

Referring now to FIG. 11, the PDL 120 may have a linear-shape or a bar shape extending in the second direction. In this case, the exposure process may be carried out by a mask including a line-shaped transparent portion substantially overlapping the upper surface of the PDL 120. Accordingly, a portion of the HTL 135b substantially overlapping the upper surface of the PDL 120 may be transformed into the second pattern 133. A remaining portion of the HTL 135b, except for the second pattern 133, may be defined as the first pattern 131.

Referring now to FIG. 13, the PDL 120 may have a linear-shape or a bar shape extending in the second direction as illustrated in FIG. 13. Meanwhile, the exposure process may be carried out by a mask including an "H"-shaped transparent portion. In this case, a portion of the HTL 135b substantially overlapping the upper surface of the PDL 120 may be transformed into the second pattern 133. A portion of the HTL 135b substantially overlapping a portion of the substrate 100 between the adjacent first electrodes 110 spaced apart from each other in the second direction may be transformed into a third pattern 137a. A remaining portion of the HTL 135b, except for the second and third patterns 133 and 137a, respectively, may be defined as the first pattern 131. An upper surface of the third pattern 137a may be substantially lower than that of the second pattern 133, and may be coplanar with that of the first pattern 131. In exemplary embodiments, the third pattern 137a may have electrical and surface properties substantially the same as, or similar to, those of the second pattern 133.

Referring to FIG. 36, the EML 150 may be formed on the first pattern 131. The EML 150 may be formed by an inkjet printing process, a nozzle printing process, a transfer process using heat or laser, etc.

Referring now to FIGS. 6 and 7, an EML 150a may be formed by, e.g., an inkjet printing process. The second and third patterns 133 and 137, respectively, may have surface energy and wettability substantially less than those of the first pattern 131. Additionally, the second and third patterns 133 and 137, respectively, may have upper surfaces substantially higher than that of the first pattern 131. Thus, the EML 150a may be formed selectively on the first pattern 131 by the above-mentioned surface properties and gravity as illustrated in FIG. 7. Therefore, blurring or smearing of ink onto non-pixel regions may be prevented so that the OLED device may have improved resolution or contrast.

Referring now to FIG. 8, an EML 150b may be formed by, e.g., a nozzle printing process. In this case, the EML 150b may be formed on the first pattern 131 and the third pattern 137 so as to continuously extend in the second direction.

Referring now to FIGS. 9 and 10, an EML 150c may be formed by, e.g., a nozzle printing process. In this case, the EML 150c may have a linear shape extending on the first pattern 131 in the second direction.

Referring now to FIGS. 11 and 12, an EML 150d may be formed by, e.g., a nozzle printing process. In this case, the EML 150d may have a linear shape extending on the first pattern 131 in the second direction.

Referring now to FIGS. 13 and 14, an EML 150e may be formed by, e.g., a nozzle printing process. In this case, the EML 150e may have a linear shape extending on the first pattern 131 and the third pattern 137a in the second direction.

Referring now to FIG. 36, a second intermediate layer 160 may be formed on the HTL 135b and the EML 150, and then a second electrode 170 may be formed on the second intermediate layer 170. Furthermore, a protection layer (not illustrated) and an upper substrate (not illustrated) may be formed on the second electrode 170 so as to obtain the OLED device according to exemplary embodiments.

In some exemplary embodiments, a third electrode electrically connected to a lead on a peripheral portion of the substrate 100 may be further formed on the second electrode 170 by processes substantially the same as, or similar to, those illustrated with reference to FIGS. 31 through 33.

Figure 37:
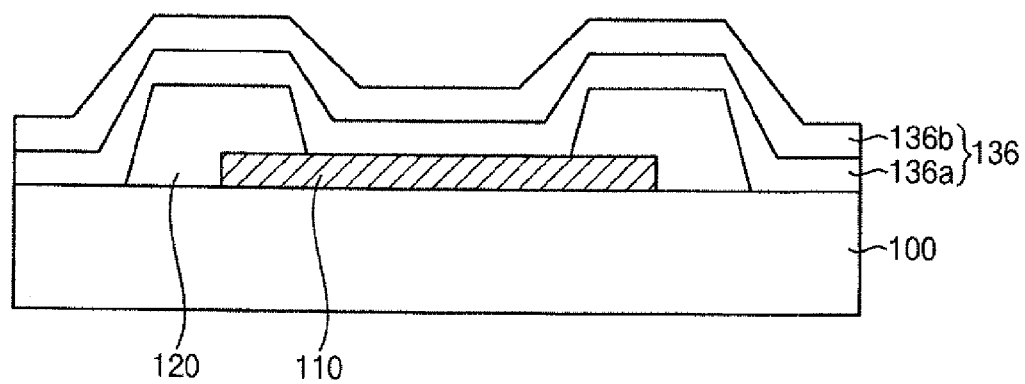
FIGS. 37 through 39 are cross-sectional views illustrating a method of manufacturing an organic light emitting display device in accordance with some exemplary embodiments of the invention.
Figure 38:
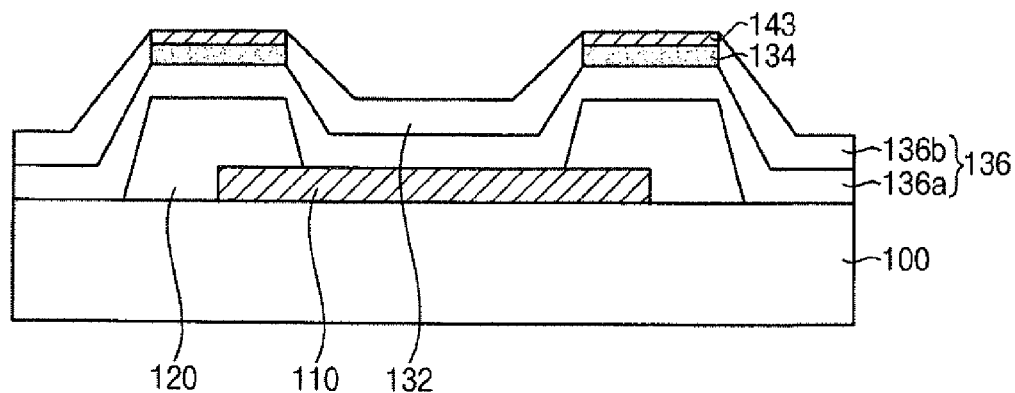
Figure 39:
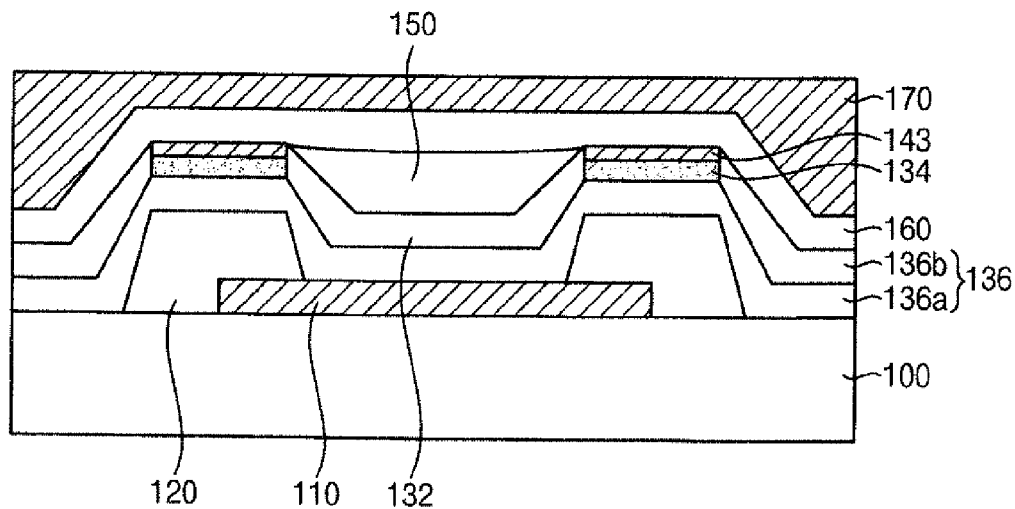

FIGS. 37 through 39 are cross-sectional views illustrating a method of manufacturing an organic light emitting display device in accordance with some exemplary embodiments of the invention. For example, FIGS. 37 through 39 illustrate a method of manufacturing the OLED devices of FIGS. 15 through 26. Detailed descriptions of processes substantially the same as, or similar to, those illustrated with reference to FIGS. 27 through 33 are omitted.

Referring to FIG. 37, a first electrode 110 may be formed on a substrate 100, and a PDL 120 partially exposing the first electrode 110 may be formed on the substrate 100. A first intermediate layer 136 covering the PDL 120 and the first electrode 110 may be formed on the substrate 100. In exemplary embodiments, the first intermediate layer 136 may include an HIL 136a and an HTL 136b sequentially stacked on the substrate 100, the PDL 120 and the first electrode 110.

The PDL 120 may be formed using a photosensitive material such as acryl-based resin, polyimide, benzocyclobutene, etc. For example, the photosensitive material may be deposited on the substrate 100 and the first electrode 110, and then exposure and developing processes may be performed to form the PDL 120. Alternatively, a carbon-fluorine containing layer may be formed on the substrate 100 and the first electrode 110 using the above-mentioned carbon-fluorine combined molecules by, e.g., a PECVD process. The carbon-fluorine containing layer may be patterned by, e.g., an etching process to form the PDL 120. The PDL 120 may include a plurality of first line patterns 120a extending in the second direction and a plurality of second line patterns 120b extending in the first direction as illustrated in FIGS. 16 through 19. In this case, the first and second line patterns 120a and 120b, respectively, may cross each other. Alternatively, the PDL 120 may have a linear shape or a bar shape extending in the second direction as illustrated in FIGS. 21 through 26.

Referring now to FIG. 37, the HTL 136b may be formed using a photosensitive composition that may include the above-mentioned hole transport material and the above-mentioned photosensitive material. The photosensitive composition may further include the above-mentioned photoinitiator. In exemplary embodiments, the photosensitive composition may further include the above-mentioned carbon-fluorine combined molecules. In some exemplary embodiments, at least one of the PDL 120 and the HTL 136b may include the carbon-fluorine combined molecules.

Referring to FIG. 38, an exposure process using, e.g., an ultraviolet light source may be performed selectively on a region that may substantially overlap an upper surface of the PDL 120 so that the HTL 136b may be divided into a first pattern 132 and a second pattern 134. In exemplary embodiments, a portion of the HTL 136b substantially overlapping the upper surface of the PDL 120 may be transformed into the second pattern 134. A remaining portion of the HTL 136b, except for the second pattern, may be defined as the first pattern 132. The second pattern 134 may include a cross-linked and/or polymerized photosensitive material.

A fluorine-containing layer 143 may be formed on the second pattern 134. During the exposure process, fluorine atoms, fluorine ions and/or fluorine-containing ions may be separated or detached from carbon atoms included in the PDL 120 and/or the HTL 136b so as to be diffused into an upper portion of the HTL 136b. The diffused fluorine atoms, fluorine ions and/or fluorine-containing ions may be fixed to an upper surface of the second pattern 134 by an ultraviolet light to form the fluorine-containing layer 143. In the case wherein the PDL 120 includes the carbon-fluorine combined molecules, the PDL 120 from which the fluorine atoms are removed may include a polymer containing repetitive carbon-carbon bonds. Accordingly, the PDL 120 may serve as an insulator. In this case, the PDL 120 may function as a black matrix when the OLED device is operated by a back-emission mode.

In exemplary embodiments, the fluorine-containing layer 143 may substantially overlap the upper surface of the PDL 120. In some exemplary embodiments, the fluorine-containing layer 143 may partially overlap a sidewall of the PDL 120.

The fluorine atoms, fluorine ions and/or fluorine-containing ions may be laterally diffused into the first pattern 132. However, these laterally diffused fluorine atoms, fluorine ions and/or fluorine-containing ions may not be fixed by the ultraviolet light, and may thereby be removed by evaporation. In one exemplary embodiment, a thermal treatment for vaporizing the fluorine atoms, fluorine ions and/or fluorine-containing ions diffused into the first pattern 132 may be further performed.

Referring now to FIGS. 16 through 18, the PDL 120 may have a substantially "H" shape. In this case, the exposure process may be carried out by a mask including an "H"-shaped transparent portion that may substantially overlap upper surfaces of the first and second line patterns 120a and 120b, respectively, of the PDL 120. Accordingly, a portion of the HTL 136b substantially overlapping the upper surface of the first line pattern 120a may be transformed into the second pattern 134, and a portion of the HTL 136b substantially overlapping the upper surface of the second line pattern 120b may be transformed into a third pattern 138. A remaining portion of the HTL 136b, except for the second and third patterns 134 and 138, respectively, may be defined as the first pattern 132. The second and third patterns 134 and 138, respectively, may cross each other in a manner substantially the same as, or similar to, that of the first and second line patterns 120a and 120b, respectively. In exemplary embodiments, the third pattern 138 may have electrical and surface properties substantially the same as, or similar to, those of the second pattern 134. Additionally, the second and third patterns 134 and 138, respectively, may have upper surfaces substantially higher than that of the first pattern 132.

First and second fluorine-containing layers 143a and 143b, respectively, may be formed on the second and third patterns 134 and 138, respectively. The first fluorine-containing layer 143a may include the fluorine atoms, fluorine ions and/or fluorine-containing ions diffused from the first line pattern 120a and/or second pattern 134. The second fluorine-containing layer 143b may include the fluorine atoms, fluorine ions and/or fluorine-containing ions diffused from the second line pattern 120b and/or the third pattern 138.

Referring now to FIGS. 19 and 20, the exposure process may be carried out by a mask including a line-shaped transparent portion substantially overlapping the upper surface of the first line pattern 120a. Accordingly, a portion of the HTL 136b substantially overlapping the upper surface of the first line pattern 120a may be transformed into the second pattern 134. A remaining portion of the HTL 136b, except for the second pattern 134, may be defined as the first pattern 132. In this case, the third pattern 138 illustrated in FIGS. 16 through 18 may not be formed. The fluorine-containing layer 143, including the fluorine atoms, fluorine ions and/or fluorine-containing ions diffused from the first line pattern 120a and/or the second pattern 134, may be formed on the second pattern 134.

Referring now to FIGS. 21 and 22, the PDL 120 may have a linear shape extending in the second direction, and the exposure process may be carried out by a mask including a line-shaped transparent portion substantially overlapping the upper surface of the PDL 120. Accordingly, a portion of the HTL 136b substantially overlapping the upper surface of the PDL 120 may be transformed into the second pattern 134. A remaining portion of the HTL 136b, except for the second pattern 134, may be defined as the first pattern 132. The fluorine-containing layer 143, including the fluorine atoms, fluorine ions and/or fluorine-containing ions diffused from the PDL 120 and/or the second pattern 134, may be formed on the second pattern 134.

Referring now to FIGS. 23 and 24, the PDL 120 may have a linear shape extending in the second direction, and the exposure process may be carried out by a mask including a substantially "H"-shaped transparent portion. In this case, a portion of the HTL 136b substantially overlapping the upper surface of the PDL 120 may be transformed into the second pattern 134. A portion of the HTL 136b substantially overlapping a portion of the substrate 100 between the adjacent first electrodes 110 spaced apart from each other in the second direction may be transformed into a third pattern 138a.

In some exemplary embodiments, as illustrated in FIG. 23, the PDL 120 may include the carbon-fluorine combined molecules. However, the HTL 136b may not include the carbon-fluorine combined molecules. In this case, the fluorine atoms, fluorine ions and/or fluorine-containing ions diffused from the PDL 120 may be fixed so as to form the fluorine-containing layer 143 on the second pattern 134. However, the fluorine-containing layer may not be formed on the third pattern 138a. The third pattern 138a may have an upper surface substantially coplanar with that of the first pattern 132.

Referring now to FIGS. 25 and 26, the PDL 120 may have a linear shape extending in the second direction, and the exposure process may be carried out by a mask including a substantially "H"-shaped transparent portion. In this case, a portion of the HTL 136b substantially overlapping the upper surface of the PDL 120 may be transformed into the second pattern 134. A portion of the HTL 136b substantially overlapping a portion of the substrate 100 between the adjacent first electrodes 110 spaced apart from each other in the second direction may be transformed into the third pattern 138a. The fluorine atoms, fluorine ions and/or fluorine-containing ions diffused from the PDL 120 and/or the second pattern 134 may be fixed so as to form a first fluorine-containing layer 143a on the second pattern 134, and the fluorine atoms, fluorine ions and/or fluorine-containing ions diffused from the third pattern 138a may be fixed so as to form a second fluorine-containing layer 143c on the third pattern 138a.

As illustrated in FIG. 25, the second fluorine-containing layer 143c may have an upper surface substantially coplanar with that of the first pattern 132.

Referring to FIG. 39, an EML 150 may be formed on the first pattern 132. The EML 150 may be obtained by a nozzle printing process, an inkjet printing process, a transfer process through heat or laser, etc.

Referring now to FIGS. 16 and 17, an EML 150f may be formed by, e.g., an inkjet process. In this case, the fluorine-containing layers 143a and 143b having hydrophobicity and relatively low ink-affinity may be formed on the second and third patterns 134 and 138, respectively. Furthermore, the second and third patterns 134 and 138, respectively, may have upper surfaces substantially higher than that of the first pattern 132. Thus, the EML 150f having a substantially island shape may be formed selectively on the first pattern 132 by the chemical properties and gravity. Therefore, blurring or smearing of ink onto non-pixel regions may be prevented so that the OLED device may have improved resolution or contrast.

Referring now to FIGS. 16 and 18, an EML 150g may be also formed by, e.g., a nozzle printing process. In this case, the EML 150g may be formed continuously on the first pattern 132 and the second fluorine-containing layer 143b in the second direction.

Referring now to FIGS. 19 and 20, an EML 150h may be formed by, e.g., a nozzle printing process. In this case, the EML 150h may be formed continuously on the first pattern 132 in the second direction.

Referring now to FIGS. 21 and 22, an EML 150i may be formed by, e.g., a nozzle printing process. In this case, the EML 150i may be formed continuously on the first pattern 132 in the second direction.

Referring now to FIGS. 23 and 24, an EML 150j may be formed by, e.g., a nozzle printing process. In this case, the EML 150j may have a linear shape extending on the first pattern 132 and the third pattern 138a in the second direction.

Referring now to FIGS. 25 and 26, an EML 150k may be formed by, e.g., a nozzle printing process. In this case, the EML 150k may have a linear shape extending on the first pattern 132 and the second fluorine-containing layer 143c in the second direction.

Referring now to FIG. 39, a second intermediate layer 160 may be formed on the HTL 136b and the EML 150, and a second electrode 170 may be formed on the second intermediate layer 160. Additionally, a protection layer (not illustrated) and an upper substrate (not illustrated) may be formed on the second electrode 170 so as to obtain the OLED device according to exemplary embodiments.

In some exemplary embodiments, a third electrode electrically connected to a lead on a peripheral portion of the substrate 100 may be further formed on the second electrode 170 by processes substantially the same as, or similar to, those illustrated with reference to FIGS. 31 through 33.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting device, comprising:
   a plurality of first electrodes spaced apart from each other on a substrate;
   a pixel defining layer disposed on the substrate, the pixel defining layer partially exposing the first electrodes;
   a first intermediate layer disposed on the pixel defining layer and the exposed first electrode, the first intermediate layer including a hole transport layer that includes a hole transport material;
   a fluorine-containing layer formed on a portion of the first intermediate layer overlapping an upper surface of the pixel defining layer, the fluorine-containing layer including fluorine diffused from the pixel defining layer or the first intermediate layer;
   an emitting layer at least partially disposed on a portion of the first intermediate layer not including the fluorine-containing layer thereon; and
   a second electrode disposed on the emitting layer.

2. The device of claim 1, wherein the first intermediate layer comprises:
   a first pattern overlapping a portion of the first electrode that is exposed by the pixel defining layer; and
   a second pattern overlapping the pixel defining layer.

3. The device of claim 2, wherein the second pattern has an electrical conductivity less than an electrical conductivity of the first pattern or an electrical resistance greater than an electrical resistance of the first pattern.

4. The device of claim 2, wherein the second pattern has an upper surface higher than an upper surface of the first pattern.

5. The device of claim 2, wherein the fluorine-containing layer is formed on the second pattern.

6. The device of claim 2, wherein the first intermediate layer further includes a third pattern overlapping a portion of the substrate between adjacent first electrodes spaced apart from each other.

7. The device of claim 6, wherein the third pattern has an electrical conductivity less than an electrical conductivity of the first pattern or an electrical resistance greater than an electrical resistance of the first pattern.

8. The device of claim 6, wherein the fluorine-containing layer includes a first fluorine-containing layer disposed on the second pattern and a second fluorine-containing layer disposed on the third pattern.

9. The device of claim 6, wherein the third pattern has an upper surface higher than an upper surface of the first pattern.

10. The device of claim 1, further comprising:
    a lead on the substrate, the lead being spaced apart from the first electrodes; and
    a third electrode disposed and extending on the second electrode and the substrate, the third electrode being electrically connected to the lead;
    wherein the third electrode is spaced apart from the first electrodes by an insulation layer pattern, the insulation layer pattern including the pixel defining layer and the first intermediate layer.

11. The device of claim 10, wherein the insulation layer pattern and the second electrode share a common etched surface.

12. An organic light emitting device, comprising:
    a plurality of first electrodes spaced apart from each other on a substrate;
    a first intermediate layer covering the first electrodes on the substrate;
    an emitting layer disposed on the first intermediate layer, the emitting layer overlapping the first electrodes; and
    a second electrode disposed on the emitting layer;
    wherein the first intermediate layer includes:
    a first pattern overlapping the first electrodes;
    a second pattern confining a lateral portion of the emitting layer; and
    a third pattern overlapping a portion of the substrate between adjacent first electrodes spaced apart from each other, the third pattern having an electrical conductivity less than an electrical conductivity of the first pattern or an electrical resistance greater than an electrical resistance of the first pattern, wherein none of the first, second and third patterns overlap one-another.

13. The device of claim 12, wherein the emitting layer extends continuously over the plurality of first electrodes.

14. The device of claim 12, wherein the emitting layer is confined by the second pattern and the third pattern so as to have an island shape.

15. The device of claim 12, wherein the third pattern has an ink-affinity less than an ink-affinity of the first pattern.

16. The device of claim 12, further comprising a fluorine-containing layer disposed on the third pattern.

17. The device of claim 16, wherein the fluorine-containing layer includes fluorine diffused from the first intermediate layer.

18. The device of claim 12, wherein the third pattern has an upper surface higher than an upper surface of the first pattern.

19. The device of claim 12, wherein the second pattern has an ink-affinity less than an ink-affinity of the first pattern.

20. The device of claim 12, further comprising a fluorine-containing layer disposed on the second pattern.

21. The device of claim 20, wherein the fluorine-containing layer includes fluorine diffused from the first intermediate layer.

22. The device of claim 12, wherein the second pattern has an electrical conductivity less than an electrical conductivity of the first pattern or an electrical resistance greater than an electrical resistance of the first pattern.

23. The device of claim 12, further comprising:
    a lead disposed on the substrate, the lead being spaced apart from the first electrodes; and
    a third electrode disposed and extending on the second electrode and the substrate, the third electrode being electrically connected to the lead;
    wherein the third electrode is spaced apart from the first electrodes by an insulation layer pattern, the insulation layer pattern including the first intermediate layer.

24. The device of claim 23, wherein the insulation layer pattern and the second electrode share a common etched surface.

25. An organic light emitting device, comprising:
    a plurality of first electrodes spaced apart from each other on a substrate;
    a first intermediate layer covering the first electrodes on the substrate;
    an emitting layer disposed on the first intermediate layer, the emitting layer overlapping the first electrodes; and
    a second electrode disposed on the emitting layer;
    wherein the first intermediate layer includes:
    a first pattern overlapping the first electrodes and is interposed between the first electrodes and the emitting layer;
    a second pattern confining a lateral portion of the emitting layer; and
    a third pattern overlapping a portion of the substrate between adjacent first electrodes spaced apart from each other, the third pattern having an ink-affinity less than an ink-affinity of the first pattern, the intermediate layer including a hole transport layer that includes a hole transport material for the emitting layer.

26. The device of claim 25, further comprising a fluorine-containing layer disposed on the third pattern.

27. The device of claim 26, wherein the fluorine-containing layer includes fluorine diffused from the first intermediate layer.

28. The device of claim 25, wherein the third pattern has an electrical conductivity less than an electrical conductivity of the first pattern or an electrical resistance greater than an electrical resistance of the first pattern.

29. The device of claim 25, wherein the third pattern has an upper surface higher than an upper surface of the first pattern.

30. The device of claim 25, wherein the second pattern has an ink-affinity less than an ink-affinity of the first pattern.

31. The device of claim 25, further comprising a fluorine-containing layer disposed on the second pattern.

32. The device of claim 31, wherein the fluorine-containing layer includes fluorine diffused from the first intermediate layer.

33. The device of claim 25, wherein the second pattern has an electrical conductivity less than an electrical conductivity of the first pattern or an electrical resistance greater than an electrical resistance of the first pattern.

34. The device of claim 25, wherein the emitting layer extends continuously over the plurality of first electrodes.

35. The device of claim 25, wherein the emitting layer is confined by the second pattern and the third pattern so as to have an island shape.

36. The device of claim 25, further comprising:
a lead on the substrate, the lead being spaced apart from the first electrodes; and
a third electrode disposed and extending on the second electrode and the substrate, the third electrode being electrically connected to the lead;
wherein the third electrode is spaced apart from the first electrode by an insulation layer pattern, the insulation layer pattern including the first intermediate layer.

37. The device of claim 36, wherein the insulation layer pattern and the second electrode share a common etched surface.

38. An organic light emitting device, comprising:
a plurality of first electrodes spaced apart from each other on a substrate;
a first intermediate layer covering the first electrodes on the substrate, wherein the first intermediate layer comprises a hole transport layer that includes a hole transporting material;
an emitting layer disposed on the first intermediate layer, the emitting layer overlapping the first electrodes; and
a second electrode disposed on the emitting layer;
wherein the first intermediate layer includes:
a first pattern overlapping the first electrodes;
a second pattern confining a lateral portion of the emitting layer; and
a third pattern overlapping a portion of the substrate between adjacent first electrodes spaced apart from each other, the third pattern having an electrical conductivity greater than an electrical conductivity of the second pattern or an electrical resistance less than an electrical resistance of the second pattern.

39. The device of claim 38, further comprising a fluorine-containing layer disposed on the second pattern.

40. The device of claim 39, wherein the fluorine-containing layer includes fluorine diffused from the first intermediate layer.

41. The device of claim 38, wherein the second pattern has an upper surface higher than an upper surface of the third pattern.

42. The device of claim 38, further comprising:
a lead disposed on the substrate, the lead being spaced apart from the first electrodes; and
a third electrode disposed and extending on the second electrode and the substrate, the third electrode being electrically connected to the lead;
wherein the third electrode is spaced apart from the first electrodes by an insulation layer pattern, the insulation layer pattern including the first intermediate layer.

43. The device of claim 42, wherein the insulation layer pattern and the second electrode share a common etched surface.

44. An organic light emitting device, comprising:
a plurality of first electrodes spaced apart from each other on a substrate;
a first intermediate layer covering the first electrodes on the substrate, wherein the first intermediate layer includes a photosensitive material that can cross link or polymerize upon exposure to radiation, and the first intermediate layer including a hole transporting layer that includes a hole transporting material;
an emitting layer disposed on the first intermediate layer, the emitting layer overlapping the first electrodes; and
a second electrode disposed on the emitting layer,
wherein the first intermediate layer includes:
a first pattern interposed between the first electrodes and the emitting layer;
a second pattern confining a lateral portion of the emitting layer; and
a third pattern overlapping a portion of the substrate between adjacent first electrodes spaced apart from each other, the third pattern having an ink-affinity greater than an ink-affinity of the second pattern.

45. The device of claim 44, further comprising a fluorine-containing layer disposed on the second pattern.

46. The device of claim 45, wherein the fluorine-containing layer includes fluorine diffused from the first intermediate layer.

47. The device of claim 44, wherein the second pattern has an electrical conductivity less than an electrical conductivity of the third pattern or an electrical resistance greater than an electrical resistance of the third pattern.

48. The device of claim 44, wherein the second pattern has an upper surface higher than an upper surface of the third pattern.

49. The device of claim 44, further comprising:
a lead disposed on the substrate, the lead being spaced apart from the first electrodes; and
a third electrode disposed and extending on the second electrode and the substrate, the third electrode being electrically connected to the lead;
wherein the third electrode is spaced apart from the first electrodes by an insulation layer pattern, the insulation layer pattern including the first intermediate layer.

50. The device of claim 49, wherein the insulation layer pattern and the second electrode share a common etched surface.

* * * * *